(12) United States Patent
Yamoto et al.

(10) Patent No.: US 6,500,256 B2
(45) Date of Patent: Dec. 31, 2002

(54) SINGLE CRYSTAL SILICON LAYER, ITS EPITAXIAL GROWTH METHOD AND SEMICONDUCTOR DEVICE

(75) Inventors: Hisayoshi Yamoto, Kanagawa (JP); Hideo Yamanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/733,500

(22) Filed: Dec. 8, 2000

(65) Prior Publication Data

US 2001/0036434 A1 Nov. 1, 2001

(30) Foreign Application Priority Data

Dec. 10, 1999 (JP) .......................................... 11-352349

(51) Int. Cl.[7] .............................................. C30B 25/02
(52) U.S. Cl. ........................... 117/89; 117/84; 117/102; 117/105
(58) Field of Search .............................. 117/84, 89, 102, 117/105

(56) References Cited

U.S. PATENT DOCUMENTS 5,814,149 A * 9/1998 Shintani et al. ............. 117/104
6,204,518 B1 * 3/2001 Adau et al. .................. 257/67

\* cited by examiner

*Primary Examiner*—Felisa Hiteshew
(74) *Attorney, Agent, or Firm*—Sonnenschein Nath & Rosenthal

(57) ABSTRACT

In case of epitaxially growing a single crystal silicon layer by catalytic CVD on a material layer in lattice alignment with single crystal silicon, i.e. a substrate of single crystal silicon, sapphire, spinel, or the like, the total pressure of the growth atmosphere is maintained in the range from $1.33 \times 10^{-3}$ Pa to 4 Pa at least in the initial period of the epitaxial growth, or alternatively, partial pressure of oxygen and moisture in the growth atmosphere is maintained in the range from $6.65 \times 10^{-10}$ to $2 \times 10^{-6}$ Pa at least in the initial period of the epitaxial growth. Thus, the maximum oxygen concentration of the epitaxially grown single crystal silicon layer becomes not higher than $3 \times 10^{18}$ atoms/cm$^{-3}$ at least in a portion with the thickness of 10 nm from the boundary with the substrate 4. It is thus ensured to epitaxially grow a high-quality single crystal silicon layer at a lower temperature than that of existing CVD.

9 Claims, 32 Drawing Sheets

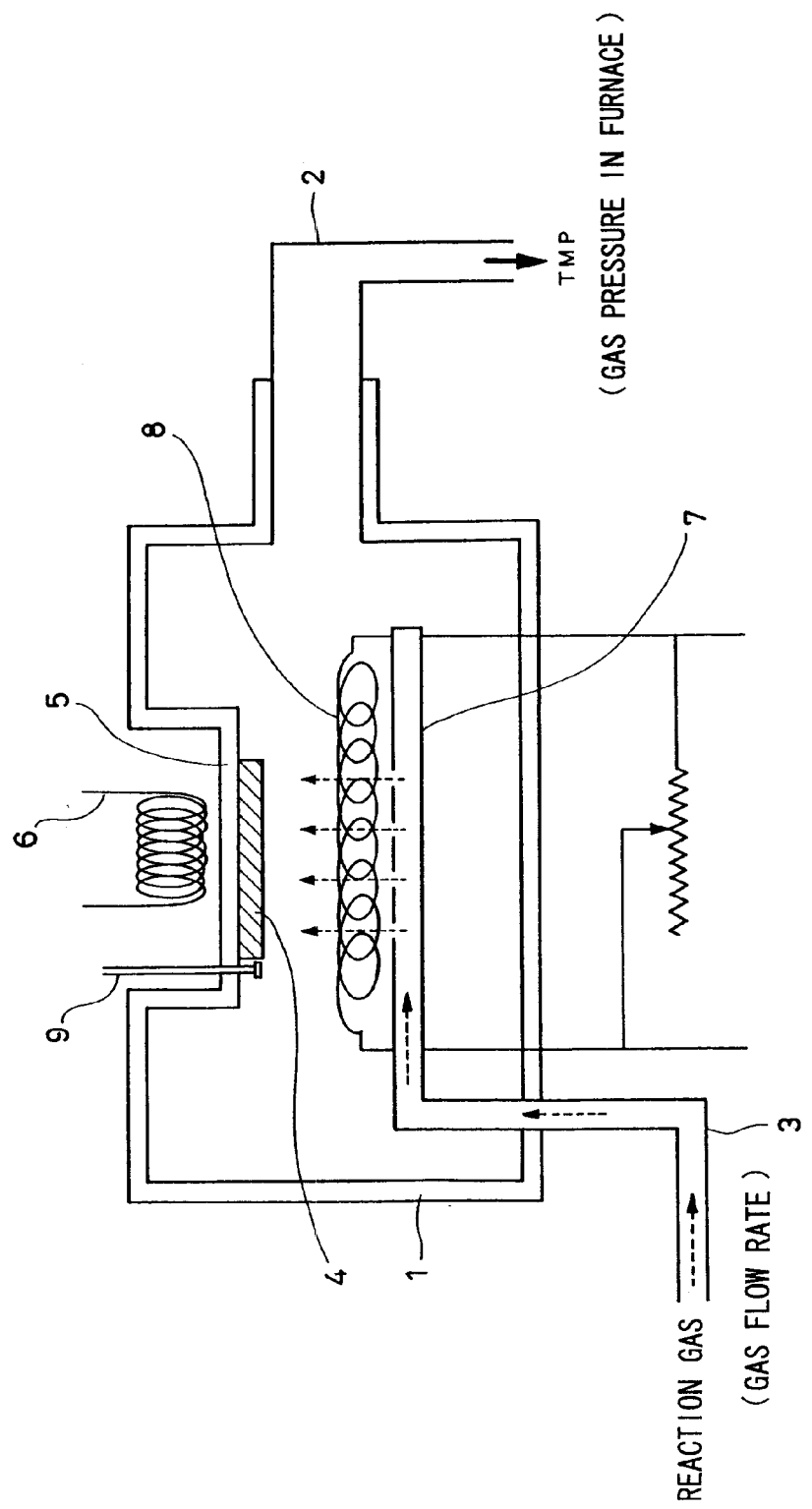

5nm
(X2000k)

SINGLE CRYSTAL SILICON LAYER, ITS EPITAXIAL GROWTH METHOD AND SEMICONDUCTOR DEVICE

RELATED APPLICATION

The present application claims priority to Japanese Application No. P11-352349 filed Dec. 10, 1999, which application is incorporated herein by reference to the extent permitted by law.

BACKGROUND OF THE INVENTION

1. Field of the Invention

This invention relates to a single-crystal silicon layer, its epitaxial growth method and semiconductor, which are suitable for use in thin-film transistors (TFT), for example.

2. Description of the Related Art

Heretofore, a typical method for epitaxially growing a single crystal silicon (Si) layer is to decompose and grow silane ($SiH_4$), dichlorosilane ($Si_2Cl_2H_4$), trichlorosilane ($SiCl_3H_4$), silicon tetrachloride ($SiCl_4$), or the like, under the temperature of about 700 through 1200° C., hydrogen atmosphere, pressure of $1.33 \times 10^4$ to $1 \times 10^5$ Pa (100 to 760 Torr) by using chemical vapor deposition (CVD).

However, the method of epitaxially growing a single crystal silicon layer by conventional CVD mentioned above involves the problem that the growth temperature is high. More specifically, in CVD, since energy required for chemical interaction and growth during epitaxial growth of a single crystal silicon layer is all supplied in form of heat energy obtained by heating a substrate to a high temperature, decreasing the growth temperature to or below 700° C. will invite a crystallographic deterioration and a decrease of the growth rate. Therefore, it is not possible to decrease the growth temperature from about 700° C. Further, when the growth temperature is in the range of about 1000 to 1200° C., the ratio of decomposed reactant gas (silane, dichlorosilane, or the like) contributing to epitaxial growth of a single crystal silicon layer is around 1 to 5%. When the growth temperature is 800° C., it further decreases to around 0.1 to 0.5%. Thus the efficiency of use of reactive gas is seriously low, and it invites an increase of its cost. Furthermore, since exhaust reactant gas (silane, dichlorosilane, and so forth) are harmful, a process for change it harmless, such as burning or absorption, is required to prevent the reactant gas from being released in the air. Therefore, when the efficiency of the use of the reactant gas seriously decreases as indicated above, the expense for the process for changing it harmless also increases.

OBJECTS AND SUMMARY OF THE INVENTION

It is therefore an object of the invention to provide a epitaxial growth method of a single crystal silicon layer capable of epitaxially growing a high-quality single crystal silicon layer at a temperature lower than that of conventional CVD; a single crystal silicon layer obtained by the method; and a semiconductor device using such a single crystal silicon layer.

The Inventor made researches toward solution of the above problems involved in conventional techniques. These researches are outlined below.

Recently, as a growth method of polycrystalline silicon layers and amorphous silicon layers, a growth method called catalytic CVD are being remarked (for example, Japanese Patent Laid-Open Publication No. hei 10-83988 and Applied Physics, Vol. 66, No. 10, p. 1094(1997)). This catalytic CVD uses catalytic cracking reaction between a heated catalyst and reactant gas (source material gas).

The Inventor made consideration about application of catalytic CVD to epitaxial growth of a single crystal silicon layer. That is, catalytic CVD, in its first stage, brings reactant gas (such as silane and hydrogen in case of using silane as the source material of silicon) into contact with a hot catalyst heated to 1600 through 1800° C., for example, to activate the reactant gas and thereby make silicon atoms, or clusters of silicon atoms, and hydrogen atoms, or clusters of hydrogen atoms, having high energies, and in its second stage, raises the temperature of these silicon atoms and hydrogen atoms or molecules having high energies, or a substrate that supplies their clusters, to a high temperature, thereby to supply and support the energy required particularly for silicon atoms to align along the crystalline orientation of the substrate. Therefore, catalytic CVD enables epitaxial growth of a single crystal silicon layer even at a lower temperature than that of conventional CVD, such as around 350° C., for example.

However, according to results of various experiments made by the Inventor, in the case where a single crystal silicon layer is epitaxially grown at a low temperature by existing catalytic CVD, oxygen is more liable to be brought into the growth layer than that epitaxially grown by conventional CVD, and the oxygen concentration in the single crystal silicon layer obtained often exceeds several atomic % (at %). This amounts at least to $5 \times 10^{20}$ atoms/$cm^3$ (atoms/cc) when converted into atomic concentration. Since the maximum solution of oxygen in silicon is $2.5 \times 10^{18}$ atoms/cc (for example, Semiconductor Handbook 2nd Edition, pp.128–129, edited by Hisayoshi Yanai, Ohmusha, 1977), and the said oxygen concentration is far beyond the maximum solution of oxygen in silicon, $2.5 \times 10^{18}$ atoms/cc. When oxygen over the maximum solution is contained in silicon, oxygen precipitates forming silicon oxide, and sometimes results in forming an oxide thin film around silicon crystal grains or sometimes results in forming oxide grains with a further increase of oxygen.

Under the circumstances, the Inventor made researches about growth conditions for epitaxial growth of a single crystal silicon layer by catalytic CVD toward obtaining a high-quality single crystal silicon layer.

That is, repeated were experiments of epitaxially growing single crystal silicon layers by using catalytic CVD and variously changing process conditions under a low temperature range (200 through 600° C.) and then evaluating them. As a result, it was found that, for growing high-quality single crystal silicon layers by catalytic CVD, conditions such as pressure of the vapor-phase growth atmosphere, partial pressure of oxygen and moisture in the growth atmosphere, and soon, were absolutely different from those of conventional CVD. More specifically, at least in the initial period of growth, the total pressure of the growth atmosphere was set to a much lower pressure than that of existing catalytic CVD, e.g., in the range from $1.33 \times 10^{-3}$ Pa to 4 Pa (from 0.01 mTorr to 30 mTorr), it was confirmed that the maximum oxygen concentration at least near the boundary with the substrate was as very low as $3 \times 10^{18}$ atoms/cc (0.006 at %), and high-quality single crystal silicon layers could be grown. Also when the partial pressure of oxygen and moisture in the growth atmosphere at least in the initial period of growth was set in the range from $6.65 \times 10^{-10}$ Pa to $2 \times 10^{-6}$ (from $0.005 \times 10^{-6}$ mTorr to $15 \times 10^{-6}$ mTorr), it was confirmed that the oxygen concentration at least near the boundary with the substrate was similarly as very low as $3\times10$ atoms/cc (0.006 at %), and high-quality single crystal silicon layers could be grown. This partial pressure of oxygen and moisture can be obtained when oxygen and moisture around 0.5 ppm in total are contained in the reactant gas.

The present invention has been made through studies based on the above knowledge of the Inventor.

According to the first aspect of the invention, there is provided a single crystal silicon layer epitaxially grown by catalytic CVD on a material layer in lattice alignment with single crystal silicon, characterized in:

the maximum oxygen concentration thereof being $3\times10^{18}$ atoms/cm$^3$ at least in a region having the thickness of 10 nm thick from the boundary between the material layer and the single crystal silicon layer.

In the first aspect of the invention, the maximum oxygen concentration at least in a region with the thickness of 10 nm from the boundary between the material layer in lattice alignment with single crystal silicon and the single crystal silicon layer is preferably not higher than $2\times10^{18}$ atoms/cm$^3$. Further, the maximum oxygen concentration at least in a region with the thickness of 50 nm, or 100 nm, from the boundary between the material layer in lattice alignment with single crystal silicon and the single crystal silicon layer is preferably not higher than $2\times10^{18}$ atoms/cm$^3$.

According to the second aspect of the invention, there is provided a single crystal silicon layer having a thickness not exceeding 1 μm epitaxially grown by catalytic CVD on a material layer in lattice alignment with single crystal silicon, characterized in:

the maximum oxygen concentration thereof being $3\times10^{18}$ atoms/cm$^3$.

In the second aspect of the invention, thickness of the single crystal silicon layer may be not larger than 100 nm, or not larger than 50 nm. Additionally, the maximum oxygen concentration is preferably not higher than $2\times18^{18}$ atoms/cm$^3$.

According to the third aspect of the invention, there is provided a single crystal silicon layer epitaxially grown by catalytic CVD on a material layer in lattice alignment with single crystal silicon, characterized in:

being epitaxially grown by maintaining the total pressure of the growth atmosphere in the range from $1.33\times10^{-3}$ Pa to 4 Pa at least in an initial period of the epitaxial growth. According to the fourth aspect of the invention, there is provided a single crystal silicon layer epitaxially grown by catalytic CVD on a material layer in lattice alignment with single crystal silicon, characterized in:

being epitaxially grown by maintaining the partial pressure of oxygen and moisture in the growth atmosphere in the range from $6.65\times10^{-10}$ Pa to $2\times10^{-6}$ Pa at least in an initial period of the epitaxial growth.

According to the fifth aspect of the invention, there is provided an epitaxial growth method for epitaxially growing a single crystal silicon layer by catalytic CVD on a material layer in lattice alignment with single crystal silicon, characterized in:

the total pressure of the growth atmosphere being maintained in the range from $1.33\times10^{-3}$ Pa to 4 Pa at least in an initial period of the epitaxial growth.

According to the sixth aspect of the invention, there is provided an epitaxial growth method for epitaxially growing a single crystal silicon layer by catalytic CVD on a material layer in lattice alignment with single crystal silicon, characterized in:

the partial pressure of oxygen and moisture in the growth atmosphere being maintained in the range from $6.65\times10^{-10}$ Pa to $2\times10^{-6}$ Pa at least in an initial period of the epitaxial growth.

According to the seventh aspect of the invention, there is provided a semiconductor device having a single crystal silicon layer which is epitaxially grown by catalytic CVD on a material layer in lattice alignment with single crystal silicon, characterized in:

the single crystal silicon layer having the maximum oxygen concentration of $3\times10^{18}$ atoms/cm$^3$ at least in a region thereof to be used as a carrier channel.

In the seventh aspect of the invention, the maximum oxygen concentration of the single crystal silicon layer is preferably not higher than $2\times10^{18}$ atoms/cm$^3$.

The semiconductor device may be basically any that uses the single crystal silicon layer. Specifically, it may be a thin-film transistor (TFT), which is MISFET, or junction FET, bipolar transistor, or the like, for example. Thickness of the carrier channel region in TFT is typically around 10 through 100 nm. Furthermore, not limited to these transistors, the semiconductor device may be a diode, capacitor or resistor, as well.

In the present invention, growth temperature of the single crystal silicon film by catalytic CVD is, for example, 200 through 600° C.

In the present invention, the base layer for epitaxially growing the single crystal silicon layer on, i.e. the material layer in lattice alignment with single crystal silicon, may be made of single crystal silicon, or sapphire, spinel, or the like. The "single crystal silicon" is used to involve those including sub-boundaries.

According to the first aspect of the invention having the above-summarized structure, since the maximum oxygen concentration is not higher than $3\times10^{18}$ atoms/cm$^3$, which is much lower than that of a single crystal silicon layer grown at a low temperature by existing catalytic CVD at least in a region with the thickness of 10 nm from the boundary between the material layer in lattice alignment with single crystal silicon and the single crystal silicon layer, a high-quality single crystal silicon layer can be obtained.

According to the second aspect of the invention having the above-summarized structure, since the maximum oxygen concentration is not higher than $5\times10^{18}$ atoms/cm$^3$, which is much lower than that of a single crystal silicon layer grown at a low temperature by existing catalytic CVD, a high-quality single crystal silicon layer can be obtained.

According to the third and fifth aspects of the invention having the above-summarized structures, since the total pressure of the growth atmosphere is set in the range from $1.33\times10^{-3}$ Pa to 4 Pa at least in the initial period of epitaxial growth, partial pressure of oxygen and moisture in the growth atmosphere can be maintained in the range from $6.65\times10^{-10}$ Pa to $2\times10^{-6}$ Pa at least in the initial period of epitaxial growth, and the amount of oxygen brought into the growth layer can be diminished significantly. As a result, the maximum oxygen concentration is not higher than $3\times10^{18}$ atoms/cm$^3$, which is much lower than that of a single crystal silicon layer grown at a low temperature by existing catalytic CVD at least in a region with the thickness of 10 nm from the boundary between the material layer in lattice alignment with single crystal silicon and the single crystal silicon layer, and therefore, a high-quality single crystal silicon layer can be obtained.

According to the fourth and sixth aspects of the invention having the above-summarized structures, since the partial pressure of oxygen and moisture in the growth atmosphere is set in the range from $6.65 \times 10^{-10}$ Pa to $2 \times 10^{-6}$ Pa at least in the initial period of epitaxial growth, the amount of oxygen brought into the growth layer can be diminished significantly. As a result, the maximum oxygen concentration is not higher than $3 \times 10^{18}$ atoms/cm$^3$, which is much lower than that of a single crystal silicon layer grown at a low temperature by existing catalytic CVD at least in a region with the thickness of 10 nm from the boundary between the material layer in lattice alignment with single crystal silicon and the single crystal silicon layer, and therefore, a high-quality single crystal silicon layer can be obtained.

According to the seventh aspect of the invention having the above-summarized structure, since the maximum oxygen concentration is not higher than $3 \times 10^{18}$ atoms/cm$^3$, which is much lower than that of a single crystal silicon layer grown at a low temperature by existing catalytic CVD at least in a region to be used as the carrier channel, the single crystal silicon layer has a high quality, and it is possible to obtain a high-performance semiconductor device like TFT having a high carrier mobility, by using this single crystal silicon layer.

The above, and other, objects, features and advantage of the present invention will become readily apparent from the following detailed description thereof which is to be read in connection with the accompanying drawings.

BRIEF DESCRIPTION OF THE DRAWINGS

FIG. 1 is a schematic diagram that shows a catalytic CVD apparatus used in an embodiment of the invention;

DETAILED DESCRIPTION OF THE PREFERRED EMBODIMENTS

Figure 2A:
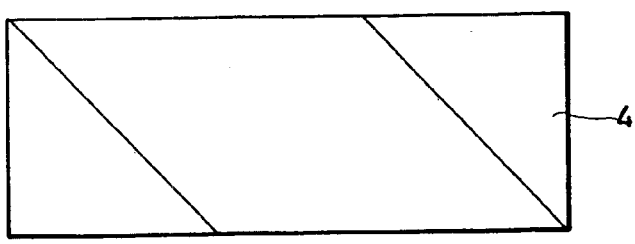
FIGS. 2A and 2B are cross-sectional views for explaining a growth method of a single crystal silicon layer by catalytic CVD according to the first embodiment of the invention.

An embodiment of the invention is explained below with reference to the drawings.

First explained is a catalytic CVD apparatus used for epitaxial growth of a single crystal silicon layer in the embodiment. FIG. 1 shows an example of catalytic CVD apparatus.

As shown in FIG. 1, the catalytic CVD apparatus includes a growth chamber 1 having a side wall to which a turbo molecular pump (TMP) is connected by an evacuation pipe 2. The growth chamber 1 can be evacuated by this TMP to a pressure around $1 \times 10^{-6}$ Pa, for example. At the bottom portion of the growth chamber 1, a gas supply pipe 3 is attached to supply reactant gas used for growth through the gas supply pipe 3 into the growth chamber 1. A substrate 4 for growing a single crystal silicon layer thereon is set to a sample holder portion 5 provided in an upper center inside the growth chamber 1 via a loadlock chamber, not shown. The sample holder portion 5 may be a graphite susceptor coated with SiC, for example, and can be heated by a heater 6 from the atmospheric air side. Between a gas blow nozzle 7 at the distal end of the gas supply pipe 3 and the sample holder portion 5, a catalyst 8 is located. Used as the catalyst 8 is a member made by winding W wire, for example, in form of a coil, reciprocally spreading the coil-like W wire over an area capable of entirely covering the substrate 4 and extending in parallel with the surface of the sample holder portion 5. The catalyst is heated by direct electric conduction. However, the catalyst 8 is not limited to a wire-like member. Temperature of the substrate 4 can be measured by a thermocouple 9 attached to the substrate holder 5 at one side of the substrate 4.

Next explained is an epitaxial growth method of a single crystal silicon layer by catalytic CVD according to this embodiment.

In this embodiment, as shown in FIG. 2A, first prepared and is a single crystal silicon substrate as the substrate 4. It is washed to remove a thin oxide film on its surface with diluted fluoric acid (1–5% water solution), then washed with pure water, and thereafter dried.

After that, the single crystal silicon substrate is mounted to the susceptor of the sample holder portion 5 inside the growth chamber 1 of the catalytic CVD apparatus shown in FIG. 1 through a loadlock chamber, not shown. The susceptor of the sample holder portion 5 is previously adjusted to the growth temperature by the heater 6.

After that, the interior of the growth chamber 1 is reduced in pressure to about $(1\sim 2)\times 10^{-6}$ Pa, for example, by TMP, especially to discharge oxygen and moisture brought into the growth chamber 1 from outside. Time required for the discharge is approximately 5 minutes, for example.

Subsequently, hydrogen is supplied from the gas supply pipe 3 into the growth chamber 1, while controlling its flow rate, pressure and the susceptor temperature to predetermined values. Pressure in the growth chamber 1 was changed in the range of 0.1~13.3 Pa (0.8~100 mTorr). The hydrogen flow rate is adjusted to 30 sccm/min.

After that, the catalyst 8 is electrically conducted to heat it 1800° C., and it is maintained at this temperature for 10 minutes, for example. The reason why hydrogen is kept flowing into the growth chamber 1 as mentioned above lies in preventing oxidation of the catalyst 8 during heating.

Figure 2B:
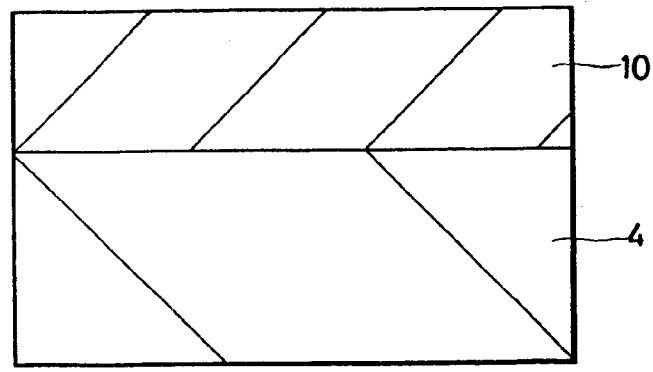

Next, the silicon layer which has predetermined thickness, for example approximately 0.5 $\mu$m, is grown by supplying silane which is added to hydrogen from the gas supply pipe 3 into the growth chamber 1. The hydrogen flow rate is adjusted to, for example, 30 sccm/min, the silane flow rate is adjusted to, for example, 0.3~2 sccm/min(100% silane is used). Thus, as shown in FIG. 2, the single crystal silicon layer 10 grows on the substrate 4, that is the single crystal silicon substrate.

After the growth, the flow rate of silane supplied to the growth chamber 1 is set to zero, and for example 5 minutes later, the electrical power supply to the catalyst 8 is stopped and the temperature is decreased.

Next, the flow rate of hydrogen supplied to the growth chamber 1 is set to zero and the pressure is reduced to about $(1\sim 2)\times 10^{-6}$ Pa, and especially the silane supplied to the interior of the growth chamber 1 is discharged. Time required for the discharge is approximately 5 minutes, for example.

After that, the single crystal silicon substrate 4 which is prepared by epitaxially growing the single crystal silicon layer 10 is taken out of the growth chamber 1 through the unfigured load lock chamber.

The silicon layer grown by the above method under the kinds of condition was evaluated by using the second ion mass spectrometry (SIMS) method and cross section transmission electron microscope (TEM). (111)-oriented single silicon crystal substrate is used as the single crystal silicon substrate. Results are explained as follows.

Figure 3:
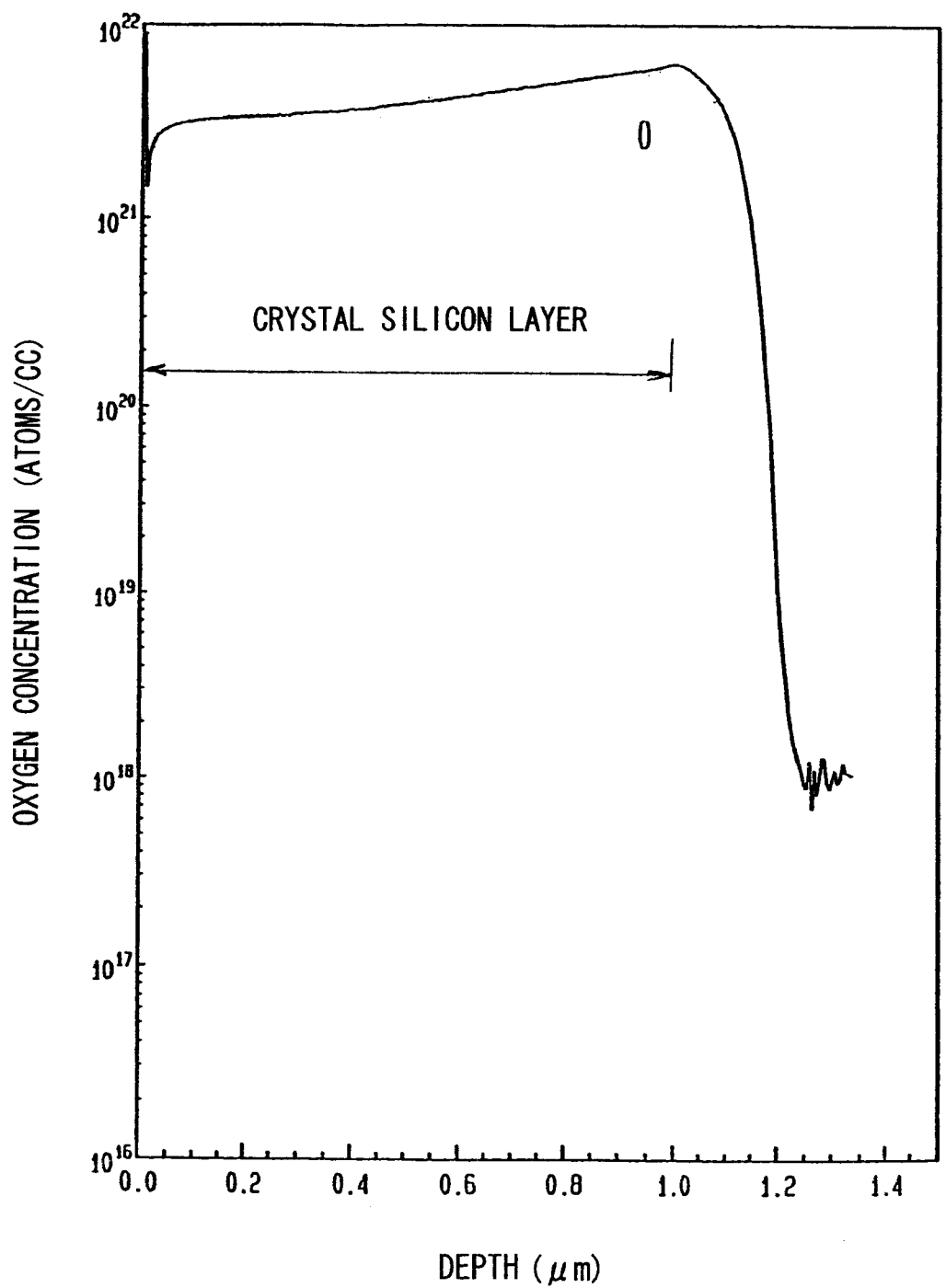
FIG. 3 is a schematic diagram that shows a result of SIMS measurement.
Figure 4:
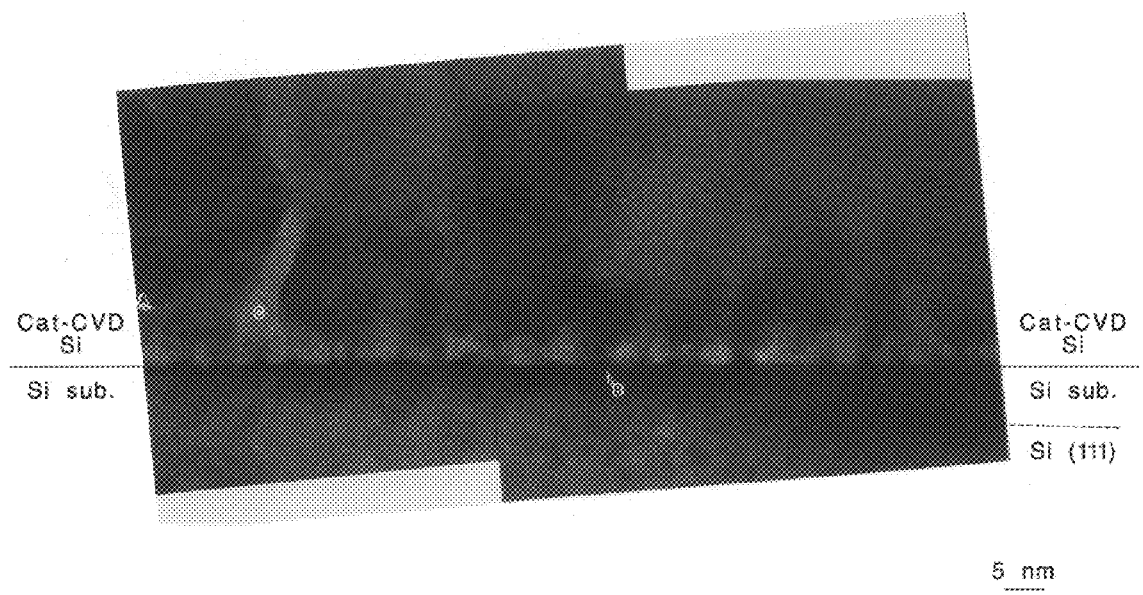
FIG. 4 is a sectional transmission electron microscopic photograph of a sample.

FIG. 3 shows a result of SIMS measurement of a sample 1 prepared by growing a silicon layer on a single crystal substrate under the condition of the catalyst temperature being 1800° C., silane flow rate being 9 sccm, hydrogen flow rate being 90 sccm, pressure being 10 Pa (75 mTorr), growth time being 20 minutes and thickness being 1250 nm. FIG. 4 shows the section TEM micrograph. It is known from FIG. 3 that oxygen of $7\times 10^{21}$ atoms/cc is contained. It is known from FIG. 4 that the silicon layer close to a border between the single crystal silicon layer close to a border between the single crystal silicon substrate is epitaxially grown.

Figure 5:
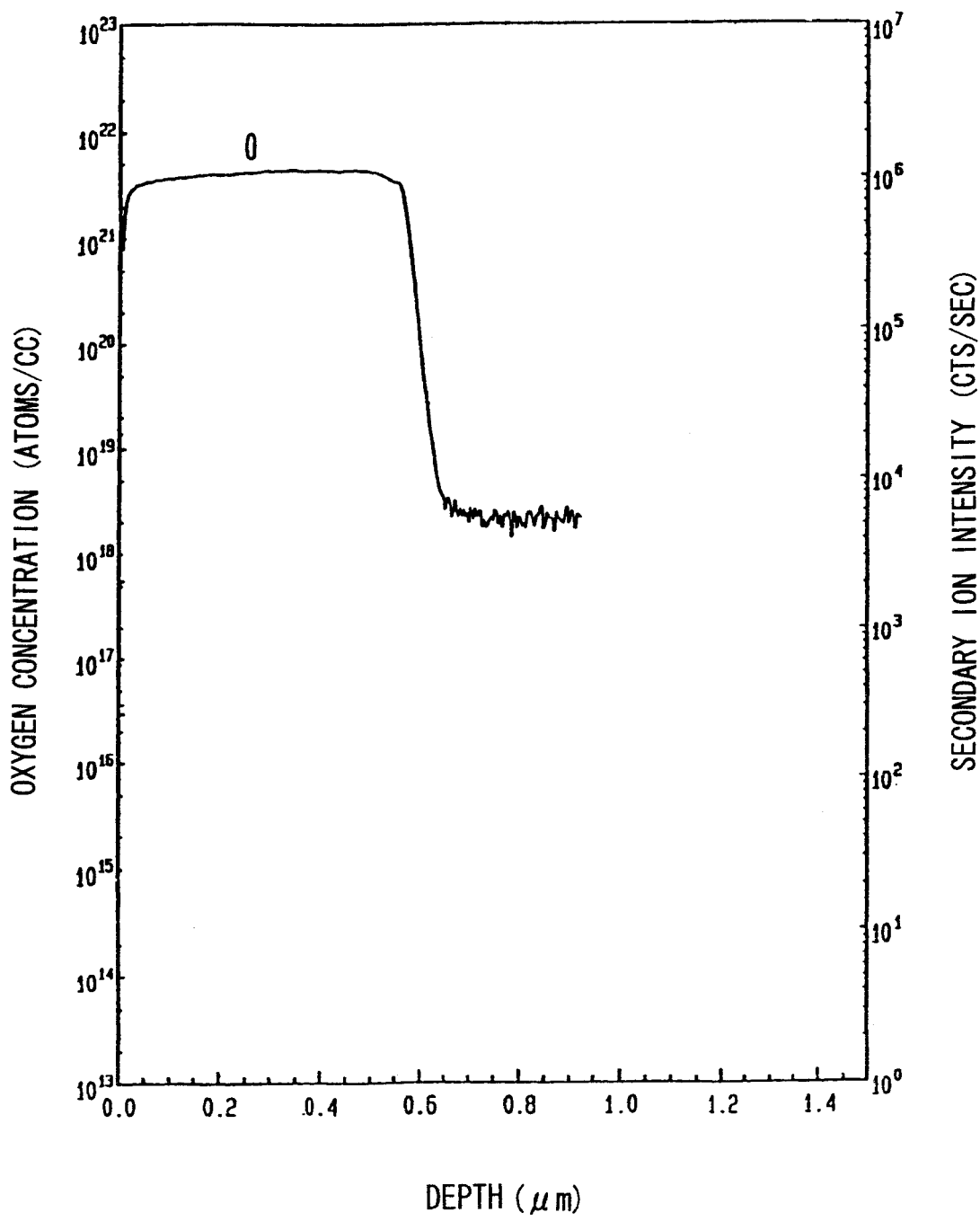
FIG. 5 is a schematic diagram that shows a result of SIMS measurement.
Figure 6:
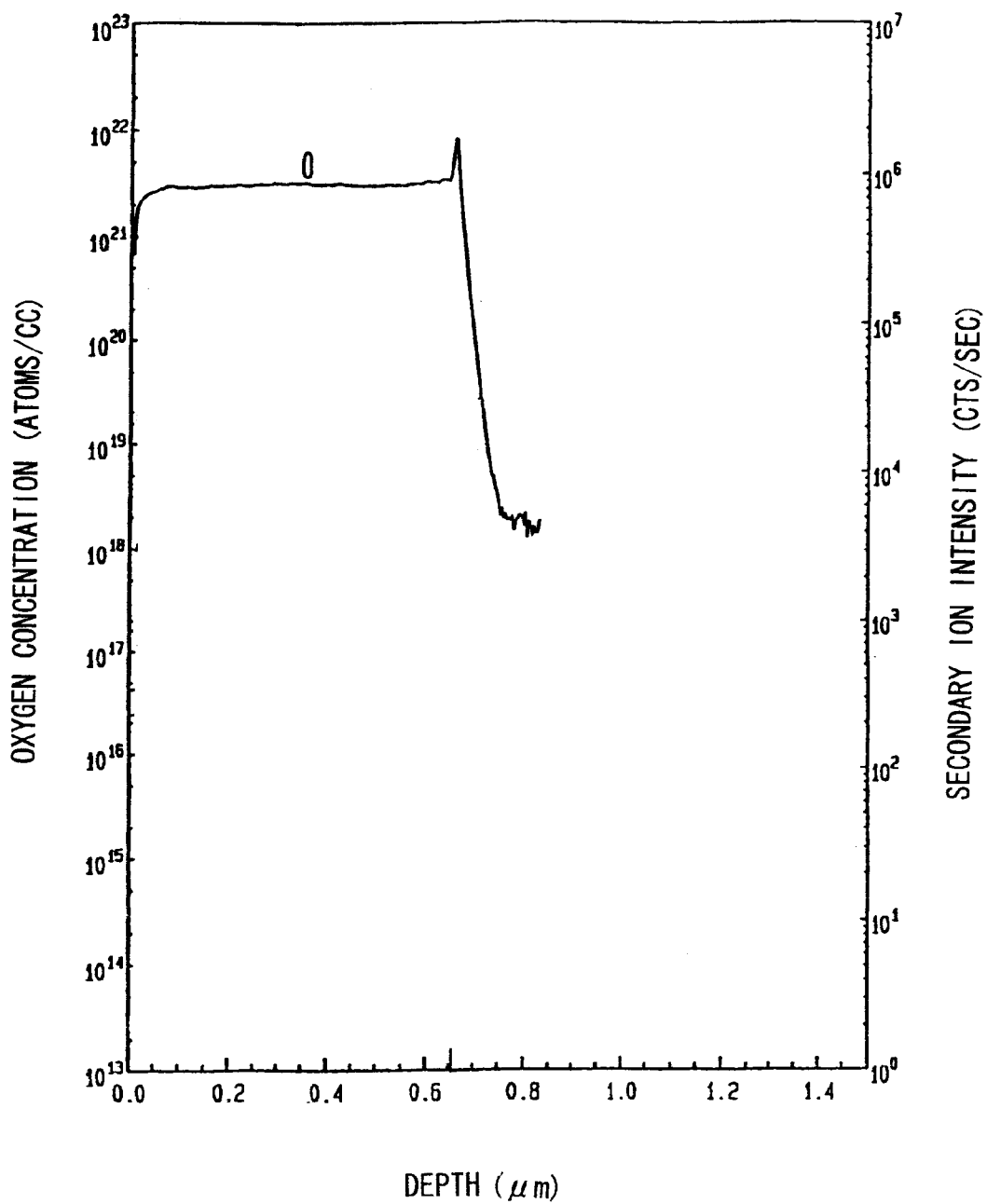
FIG. 6 is a schematic diagram that shows a result of SIMS measurement.

FIG. 5 shows a result of SIMS measurement of a sample 2 prepared by growing a silicon layer on a single crystal silicon substrate under the condition of the catalyst temperature being 1650~1700° C., silane flow rate being 3 sccm, hydrogen flow rate being 90 sccm, pressure being 12 Pa (90 mTorr), growth time being 30 minutes and thickness being 600 nm. FIG. 6 shows a result of SIMS measurement of a sample 3 prepared by growing a silicon layer on a single crystal silicon substrate under the condition of the catalyst temperature being 1650~1700° C., silane flow rate being 4.5 sccm, hydrogen flow rate being 90 sccm, pressure being 16 Pa (120 mTorr), growth time being 20 minutes and thickness being 650 nm. It is known from FIG. 5 that oxygen of $4\times 10^{21}$ atoms/cc is contained. It is known from FIG. 6 that oxygen of $3\times 10^{21}$ atoms/cc is contained.

Figure 7:
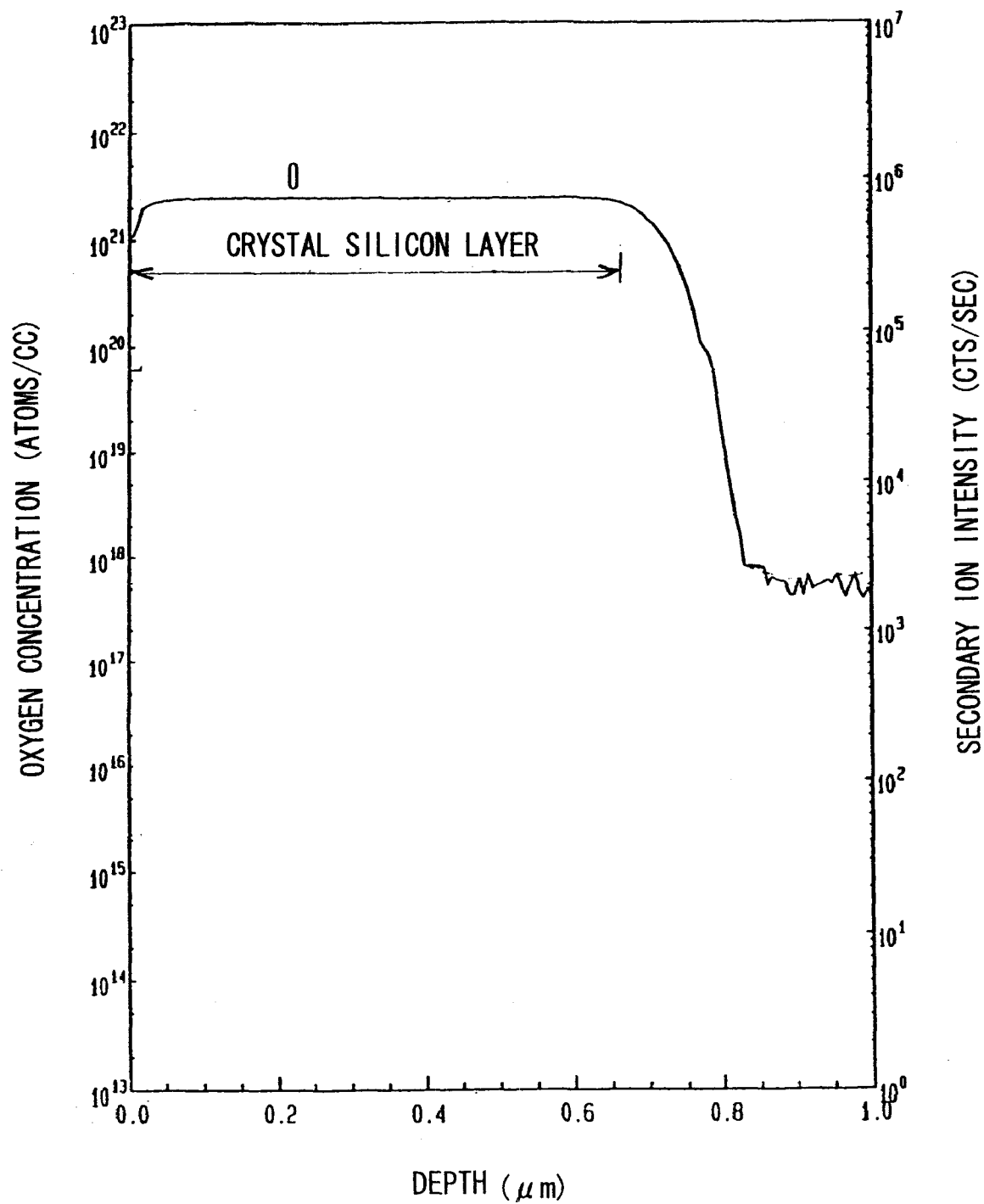
FIG. 7 is a schematic diagram that shows a result of SIMS measurement.
Figure 8:
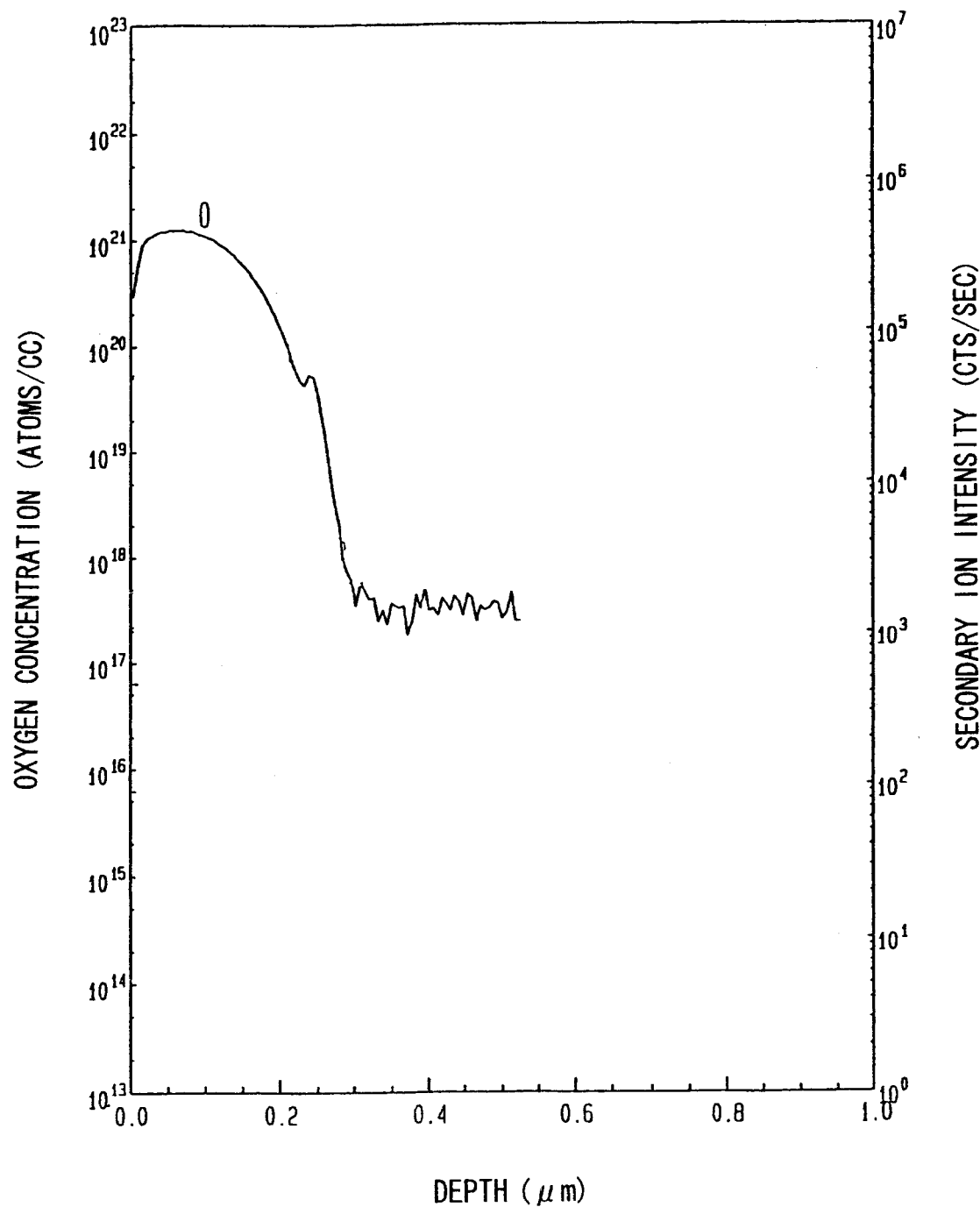
FIG. 8 is a schematic diagram that shows a result of SIMS measurement.
Figure 9:
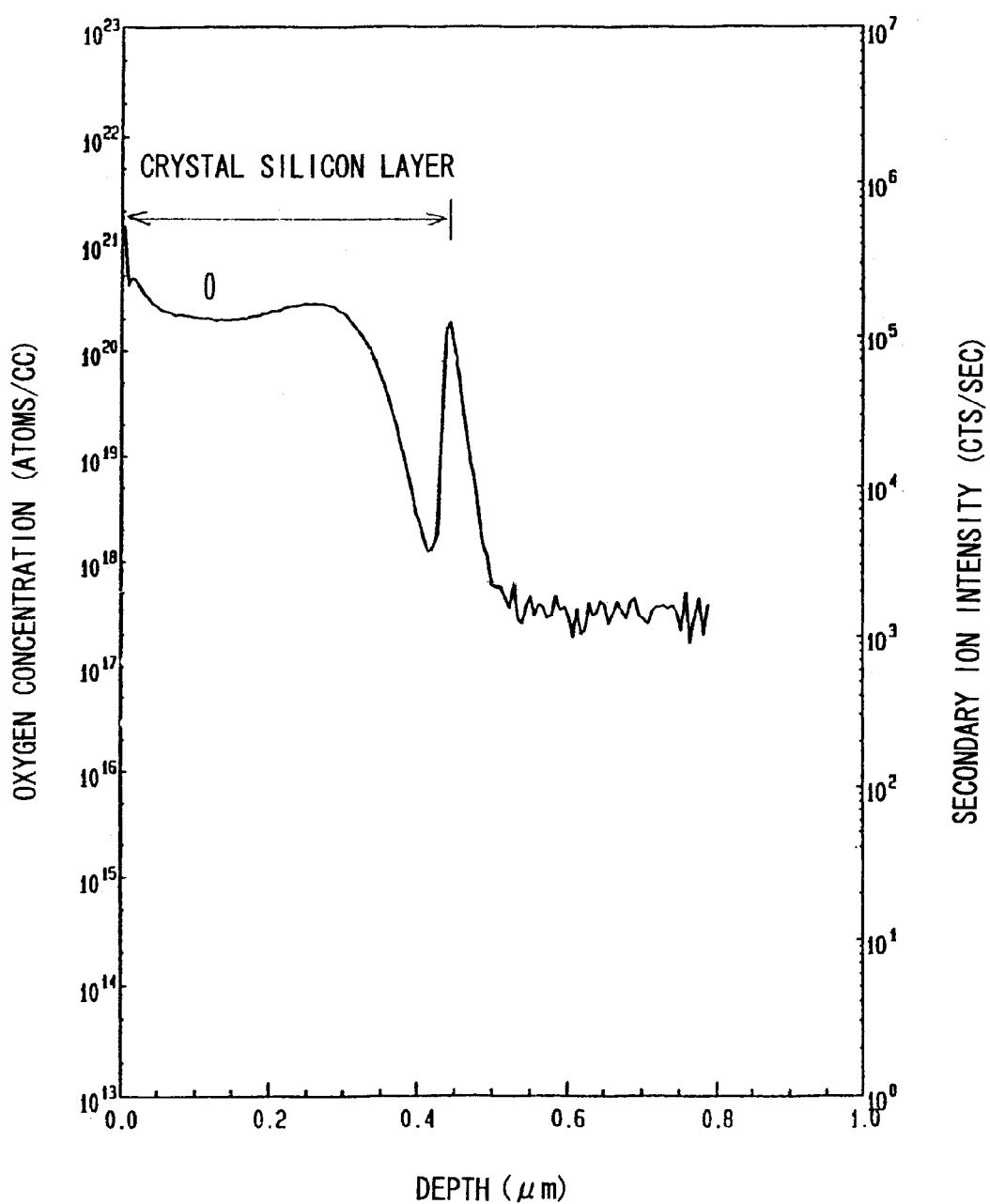
FIG. 9 is a schematic diagram that shows a result of SIMS measurement.

FIG. 7 shows a result of SIMS measurement of a sample 4 prepared by growing a silicon layer on a single crystal silicon substrate under the condition of the catalyst temperature being 1700° C., silane flow rate being 1.5 sccm, hydrogen flow rate being 100 sccm, pressure being 6.7 Pa (50 mTorr), growth time being 25 minutes and thickness being 820 nm. FIG. 8 shows a result of SIMS measurement of a sample 5 prepared by growing a silicon layer on a single crystal silicon substrate under the condition of the catalyst temperature being 1700° C., silane flow rate being 1.5 sccm, hydrogen flow rate being 100 sccm, pressure being 0.8 Pa (6 mTorr), growth time being 30 minutes and thickness being 280 nm. FIG. 9 shows a result of SIMS measurement of a sample 6 prepared by growing a silicon layer on a single crystal silicon substrate under the condition of the catalyst temperature being 1700° C., silane flow rate being 0.25 sccm, hydrogen flow rate being 30 sccm, pressure being 0.11 Pa (0.8 mTorr), growth time being 180 minutes and thickness being 480 nm. It is known from FIG. 7 that oxygen of $3\times 10^{21}$ atoms/cc is contained in the region from the boundary with the single crystal silicon substrate to the surface. It is known from FIG. 8 that oxygen is contained from the oxygen concentration of $7\times 10^{19}$ atoms/cc at the boundary with the single crystal silicon substrate to the oxygen concentration of $1\times 10^{21}$ atoms/cc in the layer. It is known from FIG. 9 that oxygen is contained from the oxygen concentration of $1\times 10^{18}$ atoms/cc at the boundary with the single crystal silicon substrate to the oxygen concentration of $2\times 10^{20}$ atoms/cc in the layer.

Figure 10:
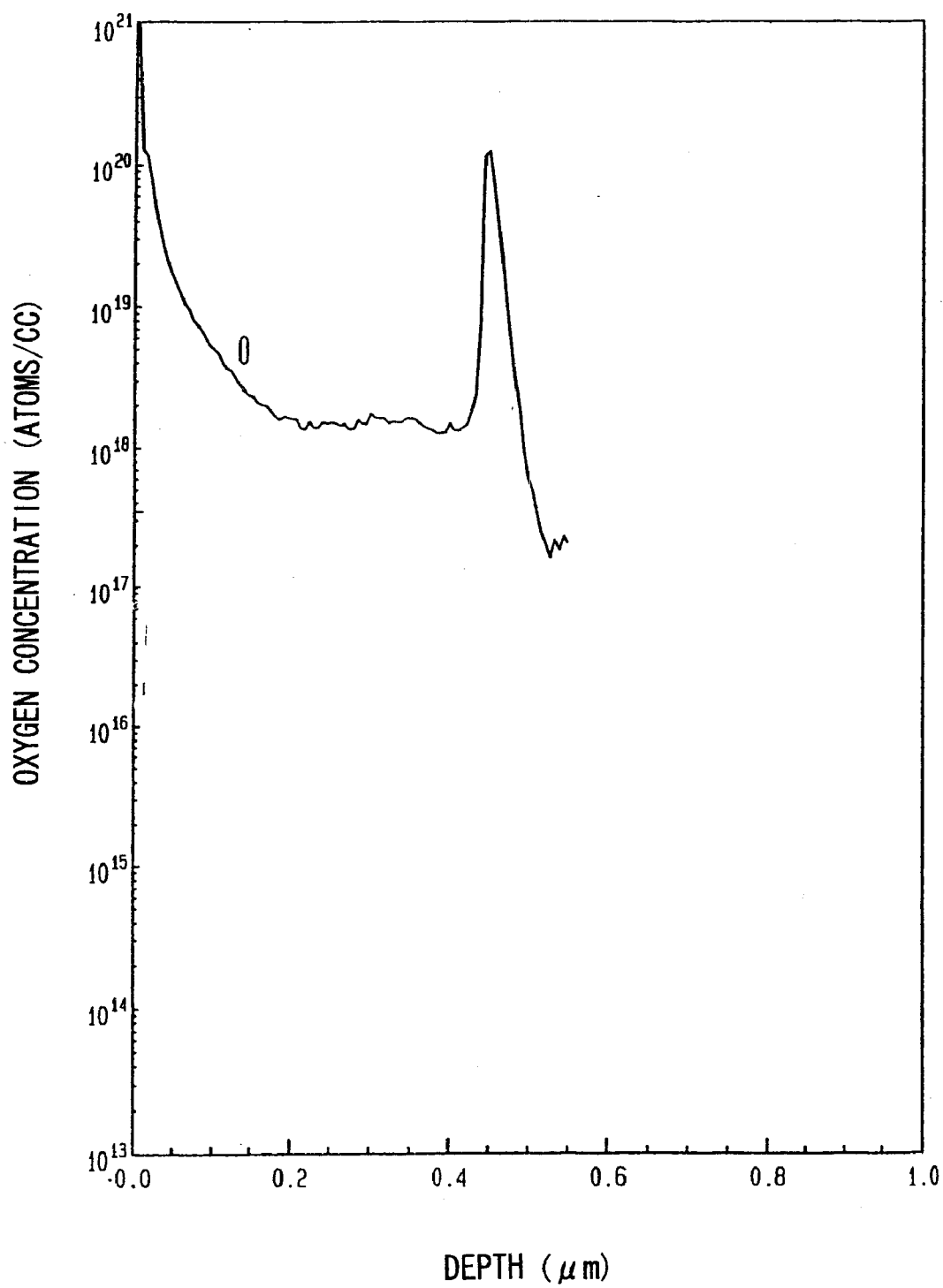
FIG. 10 is a schematic diagram that shows a result of SIMS measurement.
Figure 11:
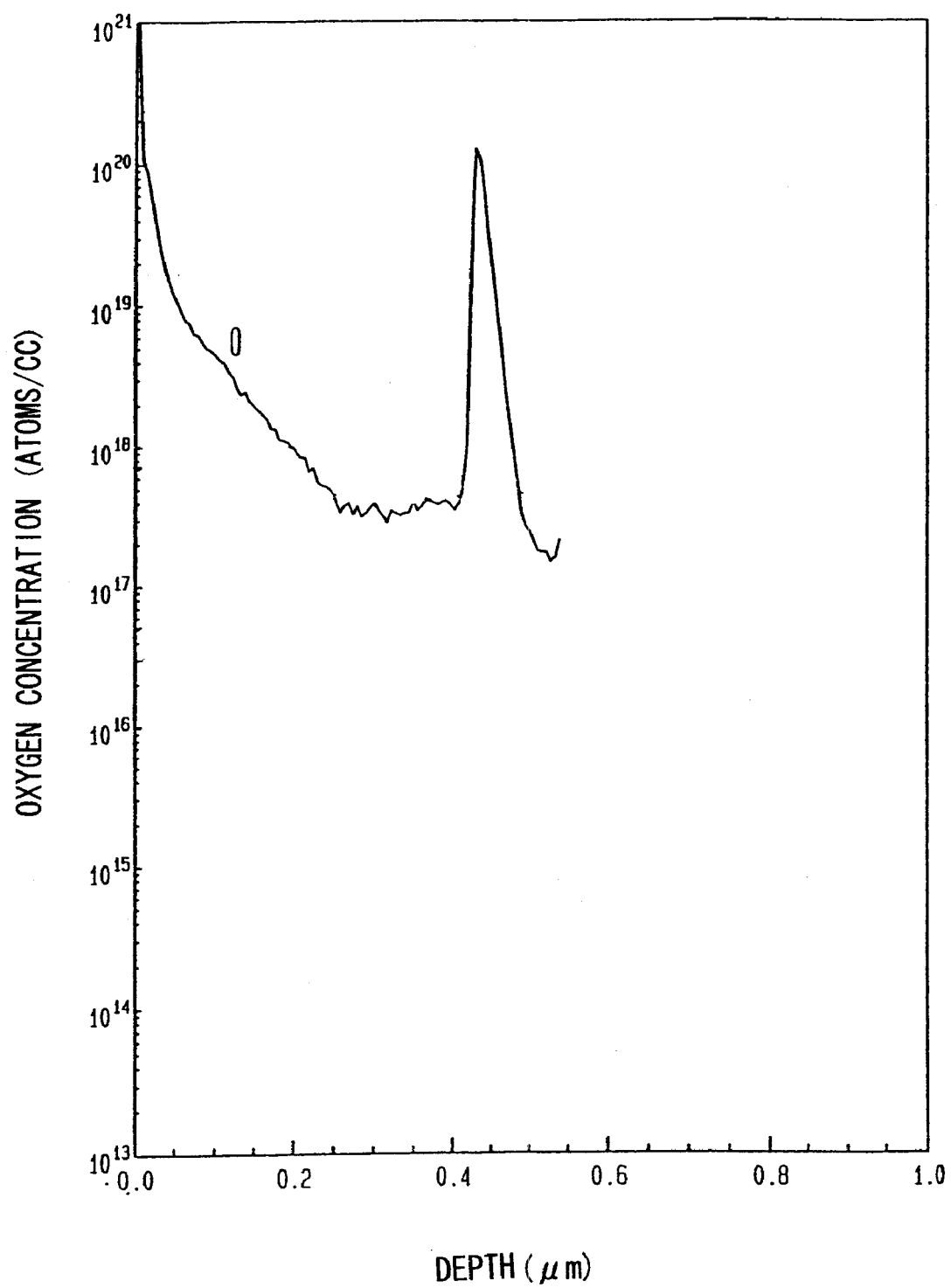
FIG. 11 is a schematic diagram that shows a result of SIMS measurement.
Figure 12:
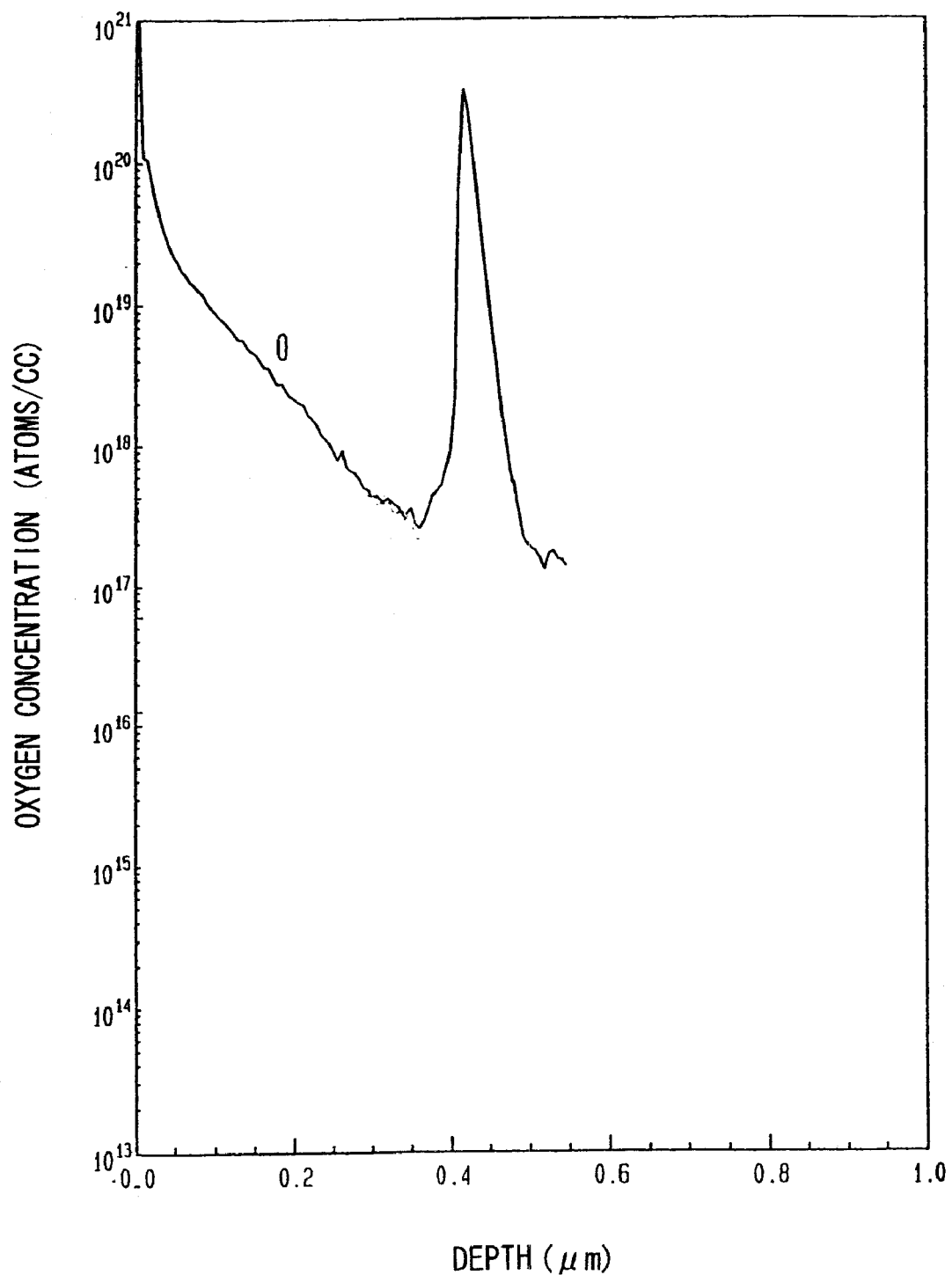
FIG. 12 is a schematic diagram that shows a result of SIMS measurement.
Figure 13:
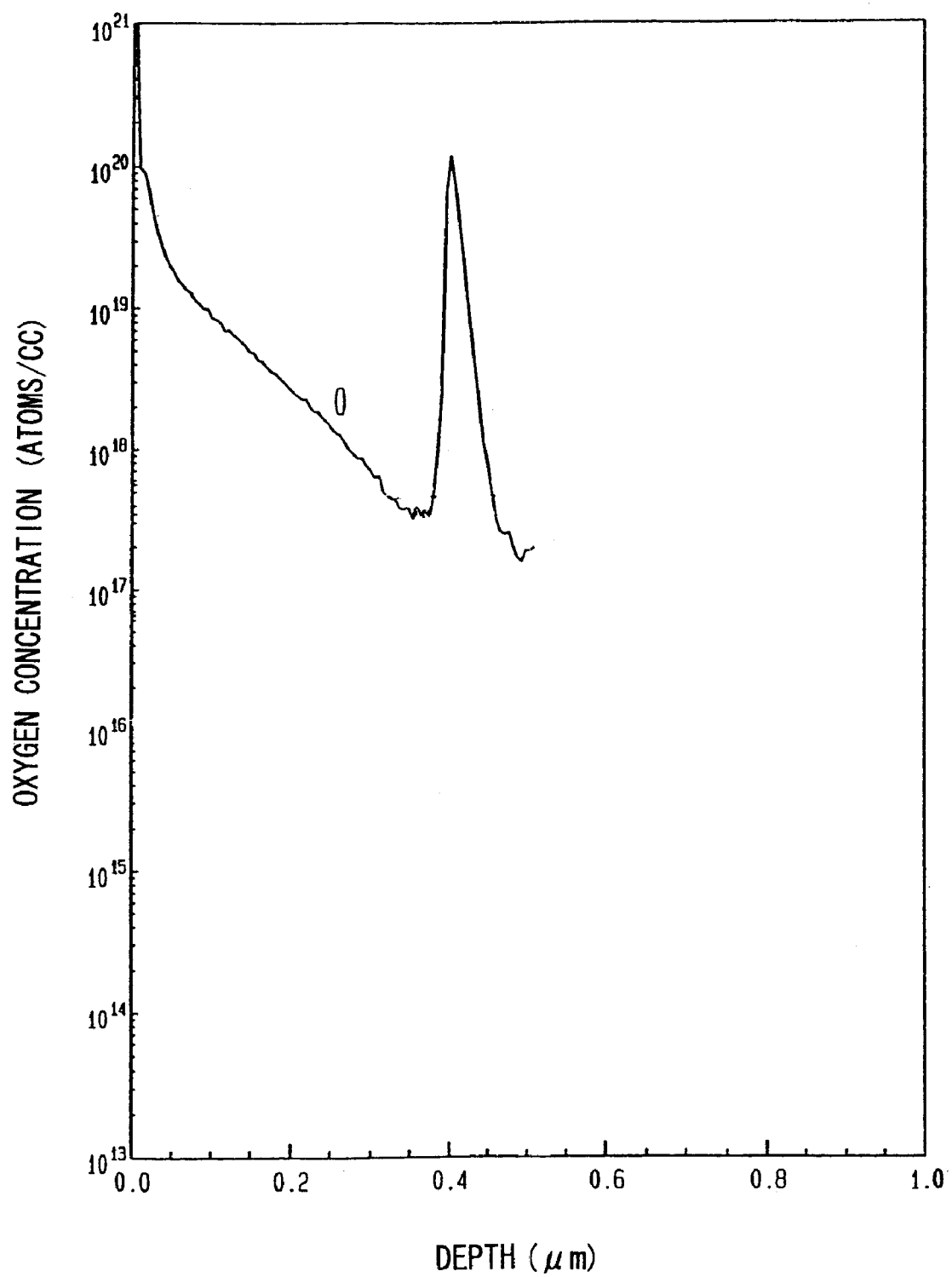
FIG. 13 is a schematic diagram that shows a result of SIMS measurement.
Figure 14:
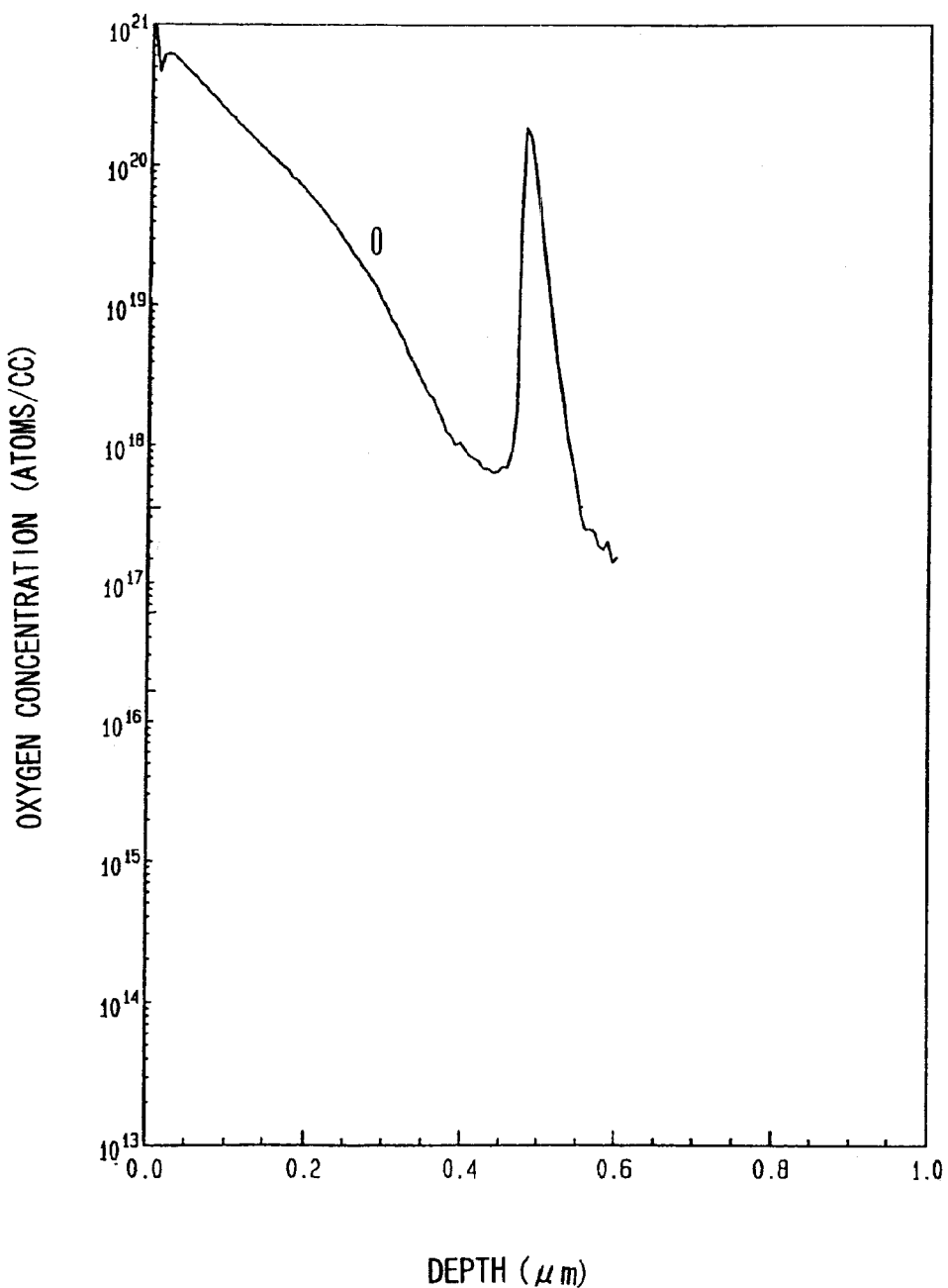
FIG. 14 is a schematic diagram that shows a result of SIMS measurement.
Figure 15:
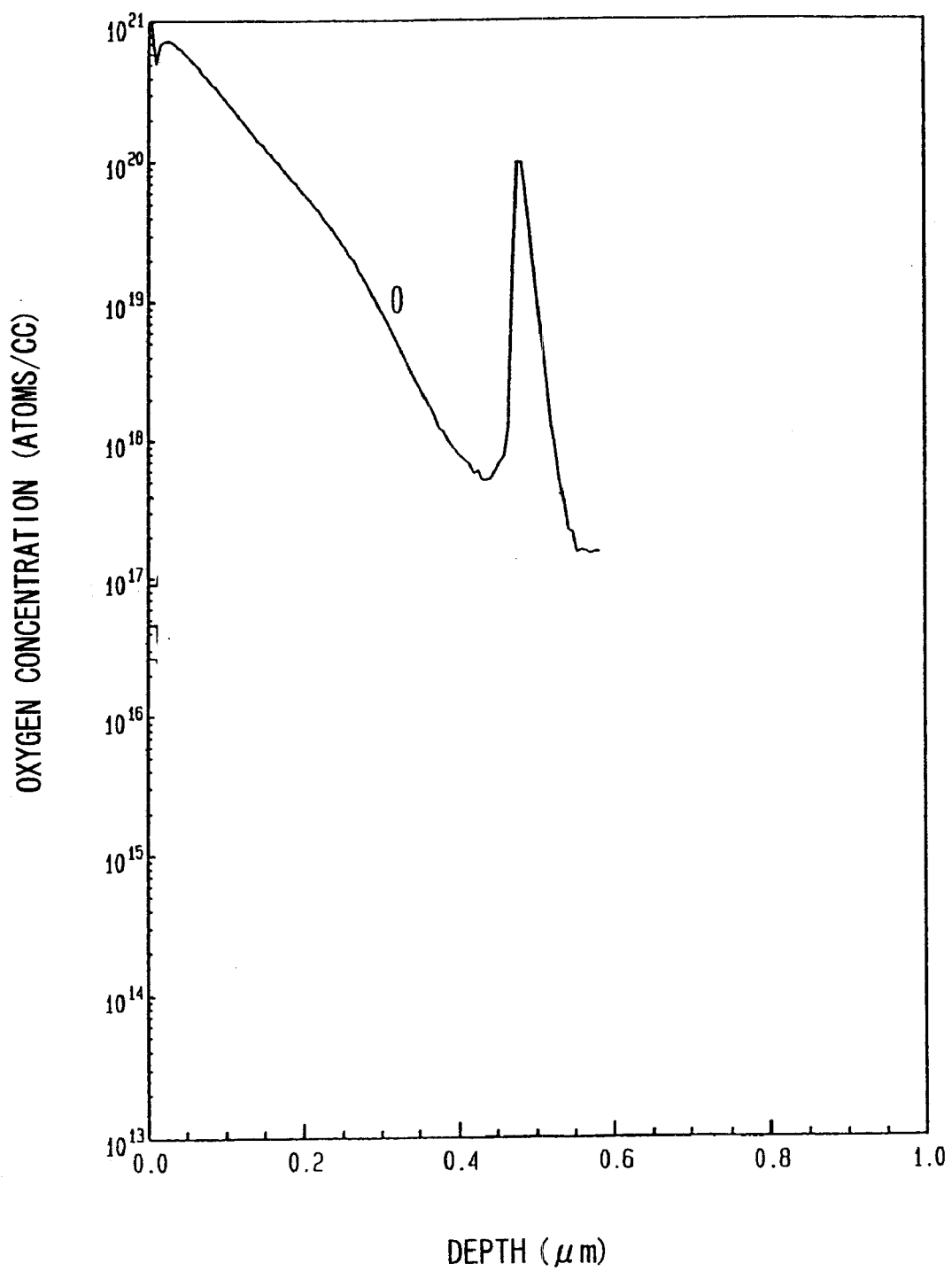
FIG. 15 is a schematic diagram that shows a result of SIMS measurement.
Figure 16:
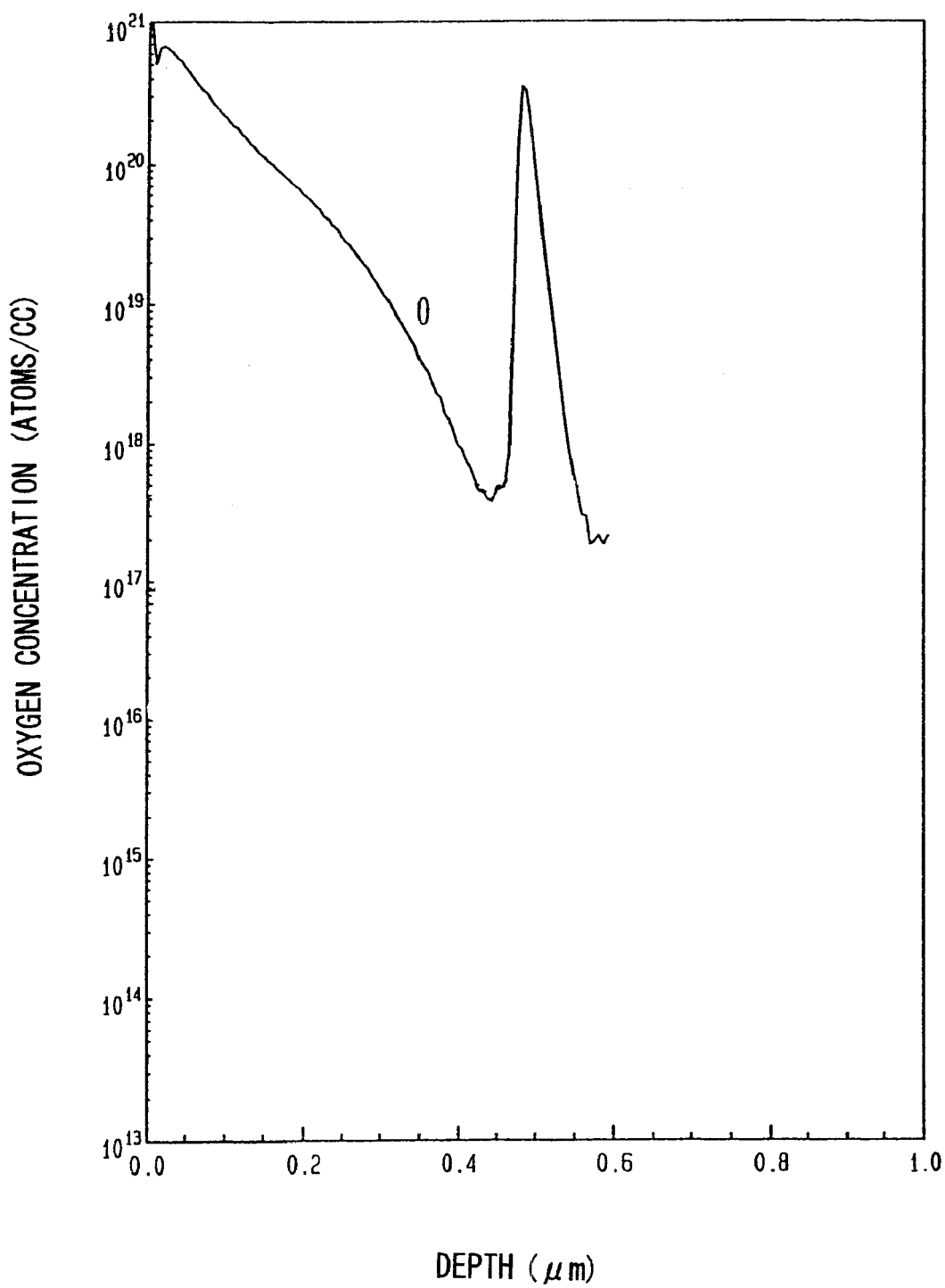
FIG. 16 is a schematic diagram that shows a result of SIMS measurement.
Figure 17:
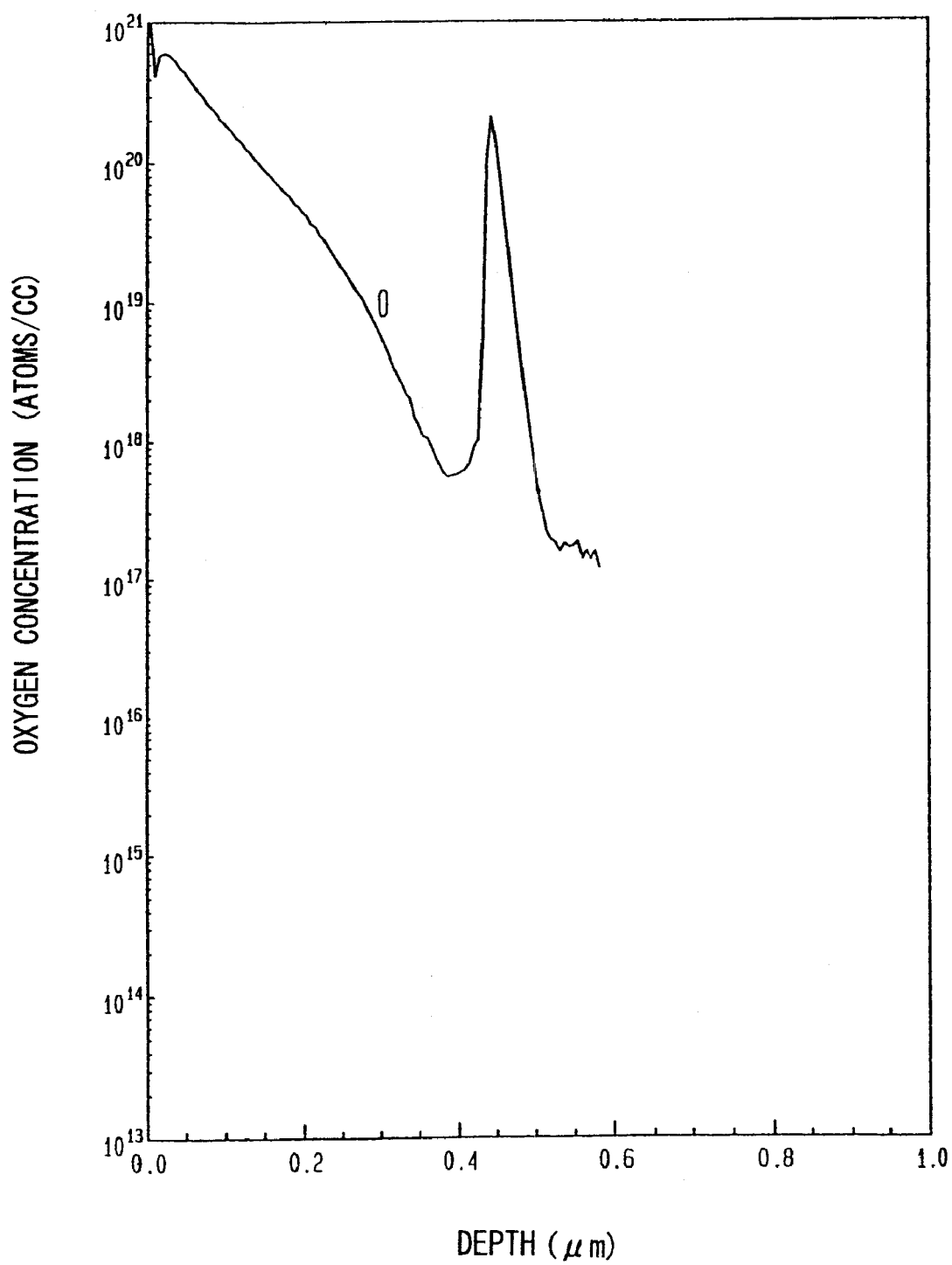
FIG. 17 is a schematic diagram that shows a result of SIMS measurement.

FIG. 10 shows a result of SIMS measurement of a sample 7 prepared by growing a silicon layer on a single crystal silicon substrate under the condition of the catalyst temperature being 1800° C., silane flow rate being 0.3 sccm, hydrogen flow rate being 30 sccm, pressure being 0.17 Pa (1.3 mTorr), growth time being 150 minutes and thickness being 420 nm. FIG. 11 shows a result of SIMS measurement of a sample 8 prepared by growing a silicon layer on a single crystal silicon substrate under the condition of the catalyst temperature being 1800° C., silane flow rate being 0.3 sccm, hydrogen flow rate being 30 sccm, pressure being 0.17 Pa (1.3 mTorr), growth time being 150 minutes and thickness being 430 nm. FIG. 12 shows a result of SIMS measurement of a sample 9 prepared by growing a silicon layer on a single crystal silicon substrate under the condition of the catalyst temperature being 1800° C., silane flow rate being 0.75 sccm, hydrogen flow rate being 30 sccm, pressure being 0.19 Pa (1.4 mTorr), growth time being 60 minutes and thickness being 390 nm. FIG. 13 shows a result of SIMS measurement of a sample 10 prepared by growing a silicon layer on a single crystal silicon substrate under the condition of the catalyst temperature being 1800° C., silane flow rate being 0.75 sccm, hydrogen flow rate being 30 sccm, pressure being 0.2 Pa (1.5 mTorr), growth time being 60 minutes and thickness being 410 nm. FIG. 14 shows a result of SIMS measurement of a sample 11 prepared by growing a silicon layer on a single crystal silicon substrate under the condition of the catalyst temperature being 1800° C., silane flow rate being 1.0 sccm, hydrogen flow rate being 30 sccm, pressure being 0.2 Pa (1.5 mTorr), growth time being 55 minutes and thickness being 500 nm. FIG. 15 shows a result of SIMS measurement of a sample 12 prepared by growing a silicon layer on a single crystal silicon substrate under the condition of the catalyst temperature being 1800° C., silane flow rate being 1.5 sccm, hydrogen flow rate being 30 sccm, pressure being 0.23 Pa (1.7 mTorr), growth time being 40 minutes and thickness being 510 nm. FIG. 16 shows a result of SIMS measurement of a sample 13 prepared by growing a silicon layer on a single crystal silicon substrate under the condition of the catalyst temperature being 1800° C., silane flow rate being 1.5 sccm, hydrogen flow rate being 30 sccm, pressure being 0.23 Pa (1.7 mTorr), growth time being 40 minutes and thickness being 450 nm. FIG. 17 shows a result of SIMS measurement of a sample 14 prepared by growing a silicon layer on a single crystal silicon substrate under the condition of the catalyst temperature being 1800° C., silane flow rate being 2.0 sccm, hydrogen flow rate being 30 sccm, pressure being 0.24 Pa (1.8 mTorr), growth time being 30 minutes and thickness being 450 nm. It is known from FIG. 10 that oxygen of $1.5 \times 10^{18}$ atoms/cc is contained. It is known from FIG. 11 that oxygen of $4 \times 10^{17}$ atoms/cc is contained. It is known from FIG. 12 that oxygen of $3 \times 10^{17}$ atoms/cc is contained. It is known from FIG. 13 that oxygen of $4 \times 10^{17}$ atoms/cc is contained. It is known from FIG. 14 that oxygen of $8 \times 10^{17}$ atoms/cc is contained. It is known from FIG. 15 that oxygen of $5 \times 10^{17}$ atoms/cc is contained. It is known from FIG. 16 that oxygen of $4 \times 10^{17}$ atoms/cc is contained. It is known from FIG. 17 that oxygen of $5 \times 10^{17}$ atoms/cc is contained.

These results of SIMS measurement exhibit that the maximum oxygen concentration (especially the maximum oxygen concentration near the boundary with the substrate 4) in a single crystal silicon layer epitaxially grown by catalytic CVD is getting lower as the growth pressure decreases and more oxygen is brought into the growth layer in proportion to the growth pressure. They also exhibit that the oxygen concentration increases as the growth time becomes longer.

Figure 18:
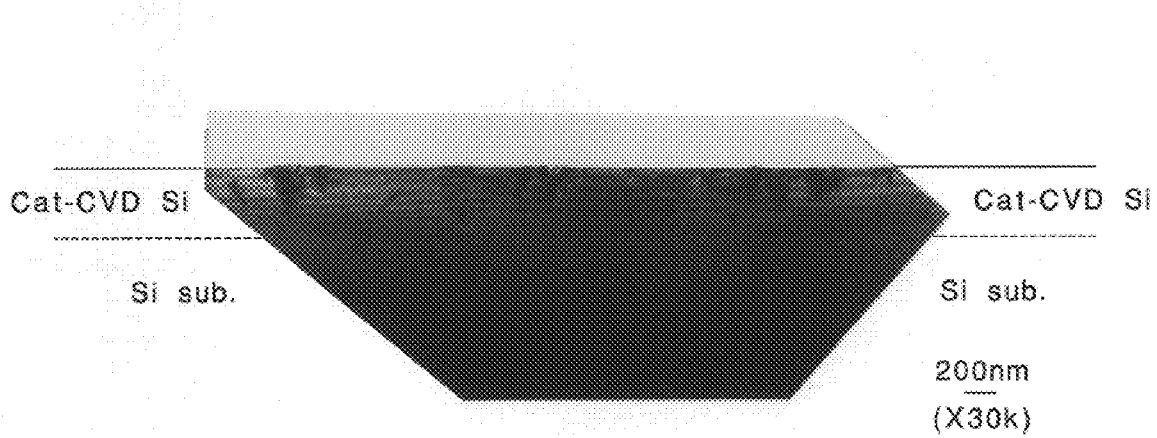
FIG. 18 is a sectional transmission electron microscopic photograph of a sample.
Figure 19:
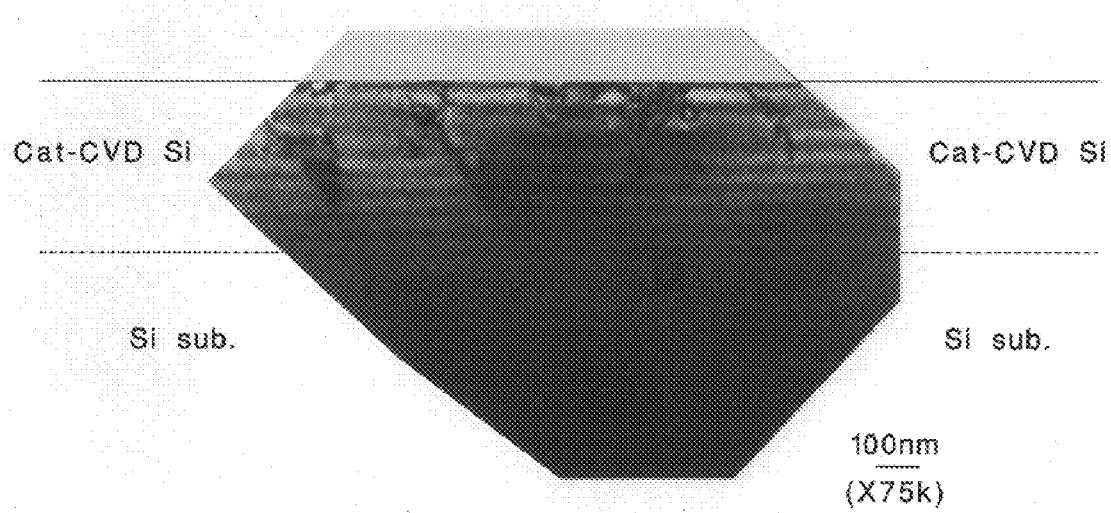
FIG. 19 is a sectional transmission electron microscopic photograph of a sample.

FIGS. 18 and 19 show sectional TEM photographs of the sample 7. FIG. 18 is a sectional TEM photograph of the entire aspect of a cross section of the single crystal silicon layer taken by a low magnification (30000 times) whereas FIG. 19 is a sectional TEM photograph of the entire aspect of a cross section of the single crystal silicon layer taken by a high magnification (75000 times). From FIGS. 18 and 19, a number of crystal defects are observed. The stripe patterns appearing in parallel on the sample surfaces are interference fringes of equal thickness caused by the wedge-like shapes of the samples that become thinner toward their surfaces (also in the subsequent samples).

Figure 20:
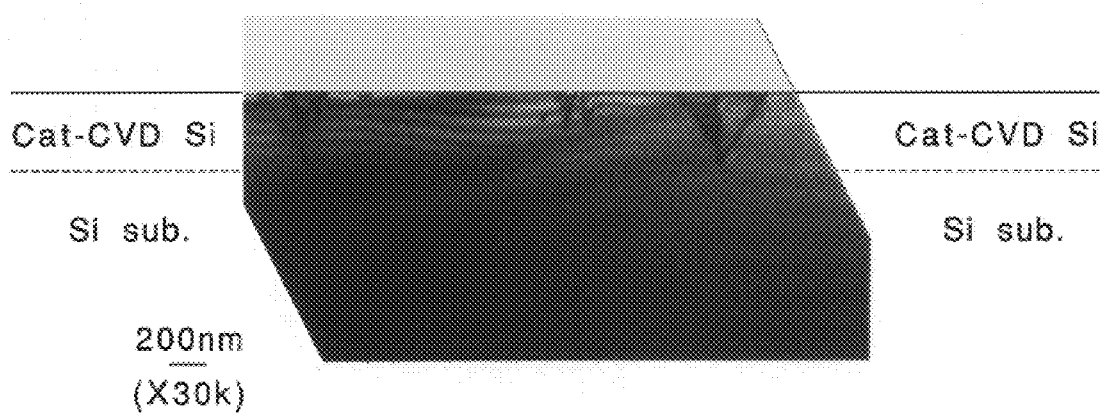
FIG. 20 is a sectional transmission electron microscopic photograph of a sample.
Figure 21:
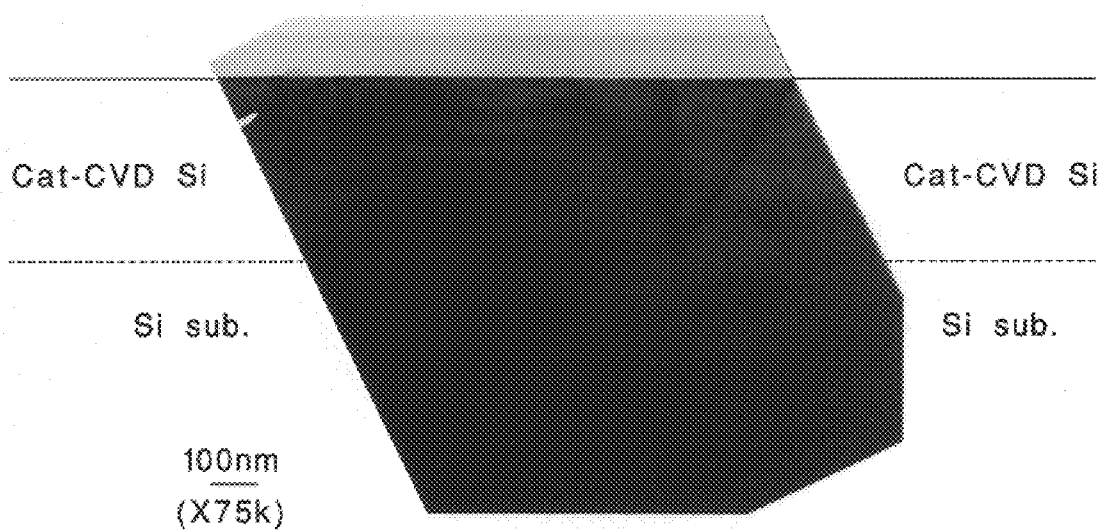
FIG. 21 is a sectional transmission electron microscopic photograph of a sample.
Figure 22:
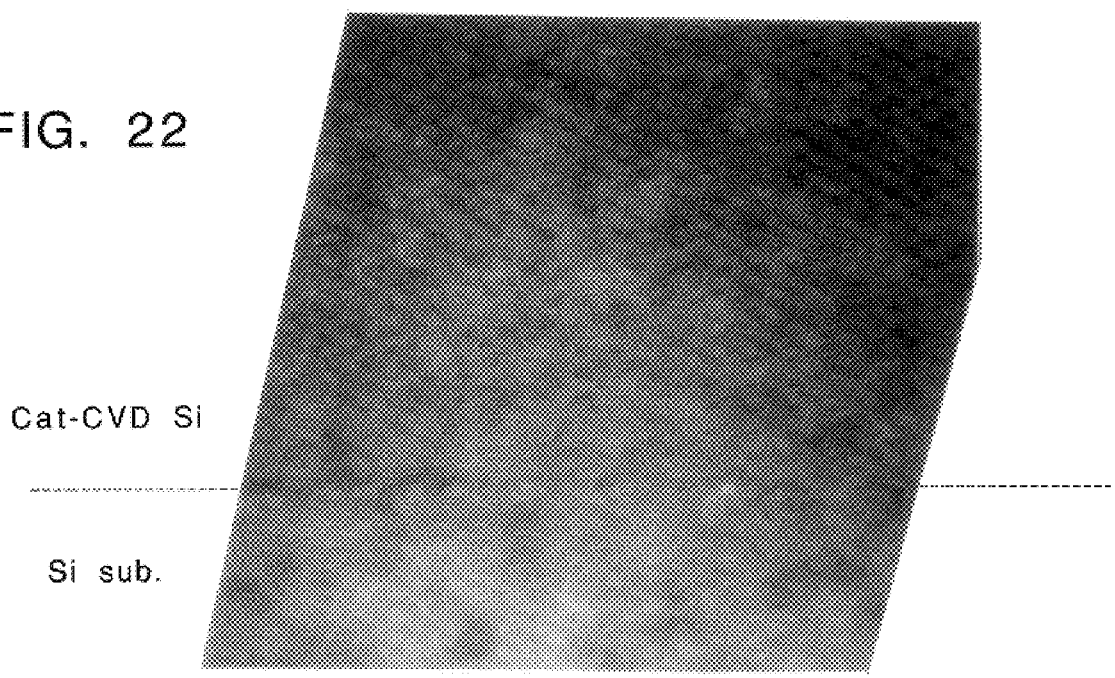
FIG. 22 is a sectional transmission electron microscopic photograph of a sample.
Figure 23:
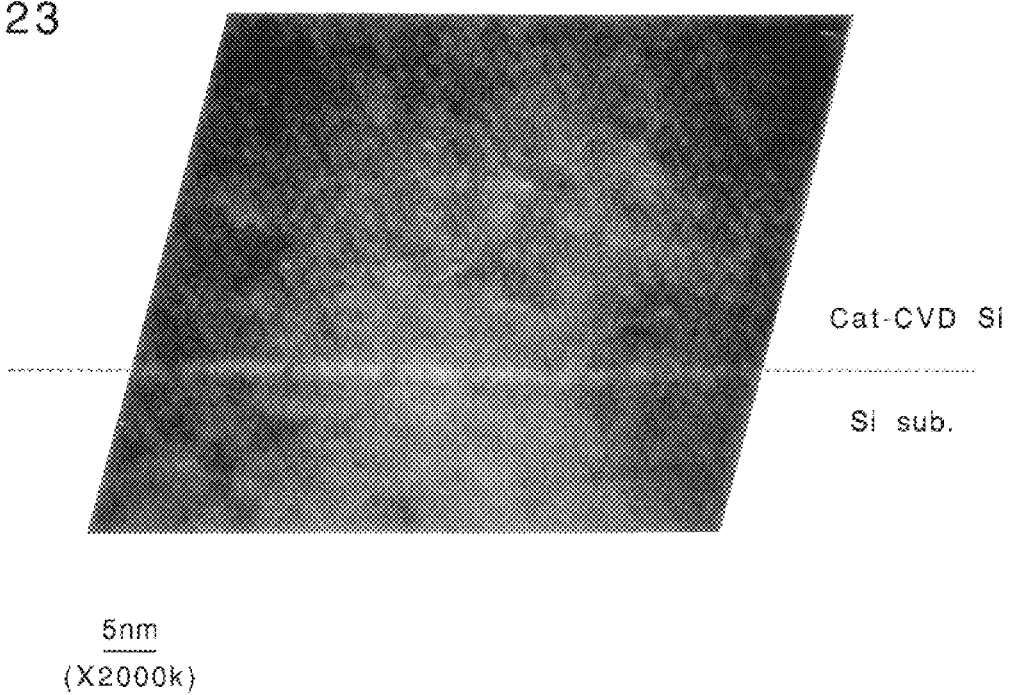
FIG. 23 is a sectional transmission electron microscopic photograph of a sample.

FIGS. 20 through 23 show sectional TEM photographs of the sample 9. FIG. 20 is a sectional TEM photograph of the entire aspect of a cross section of the single crystal silicon layer taken by a low magnification (30000 times) FIG. 21 is a sectional TEM photograph of the entire aspect of a cross section of the single crystal silicon layer taken by a high magnification (75000 times). FIG. 22 is a high-resolution sectional TEM photograph of a portion near the boundary between the single crystal silicon layer and the single crystal silicon substrate taken by a still higher magnification (2000000 times). FIG. 23 is a high-resolution sectional TEM photograph of a portion near the boundary between the single crystal silicon layer and the single crystal silicon substrate but different from the portion of FIG. 22, taken by the same magnification (2000000 times). It is known from FIGS. 20 through 23 that single crystal silicon layers with less crystal defects are obtained. In FIGS. 22 and 23, it is observed that rows of Si atoms are orderly aligned along boundaries between single crystal silicon layers and single crystal silicon substrates. Although a difference in contrast is observed along boundaries between single crystal silicon layers and single crystal silicon substrates, it is assumed that distortion or stress entering into the boundaries appears as a contrast.

Figure 24:
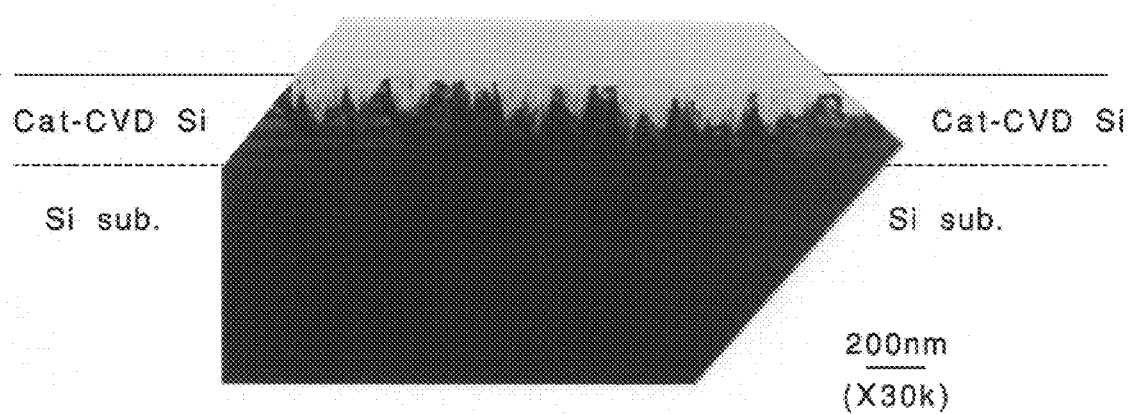
FIG. 24 is a sectional transmission electron microscopic photograph of a sample.
Figure 25:
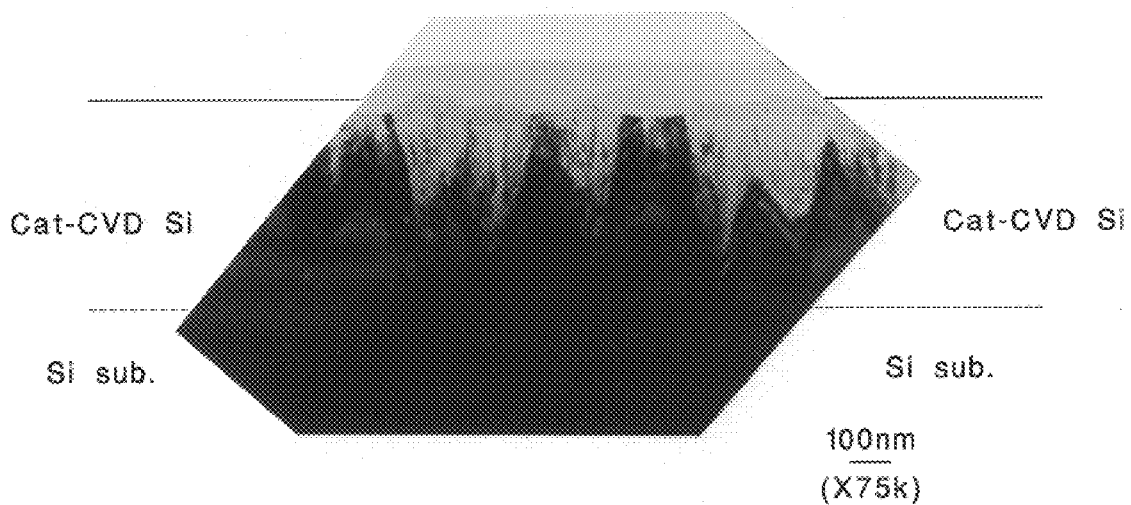
FIG. 25 is a sectional transmission electron microscopic photograph of a sample.
Figure 26:
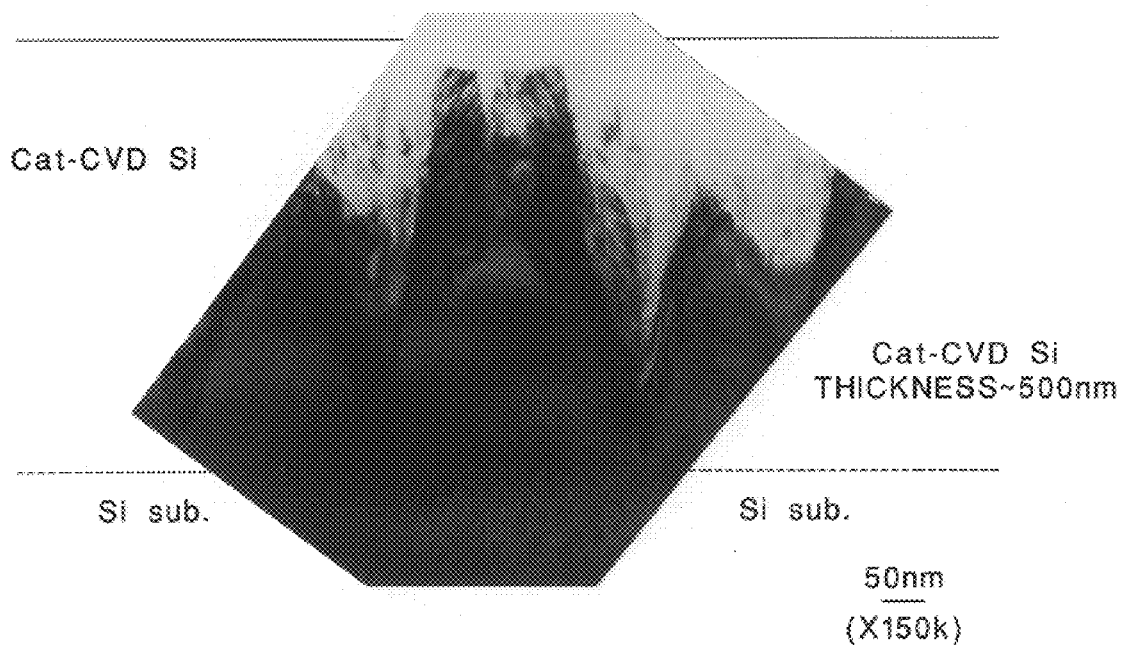
FIG. 26 is a sectional transmission electron microscopic photograph of a sample.
Figure 27:
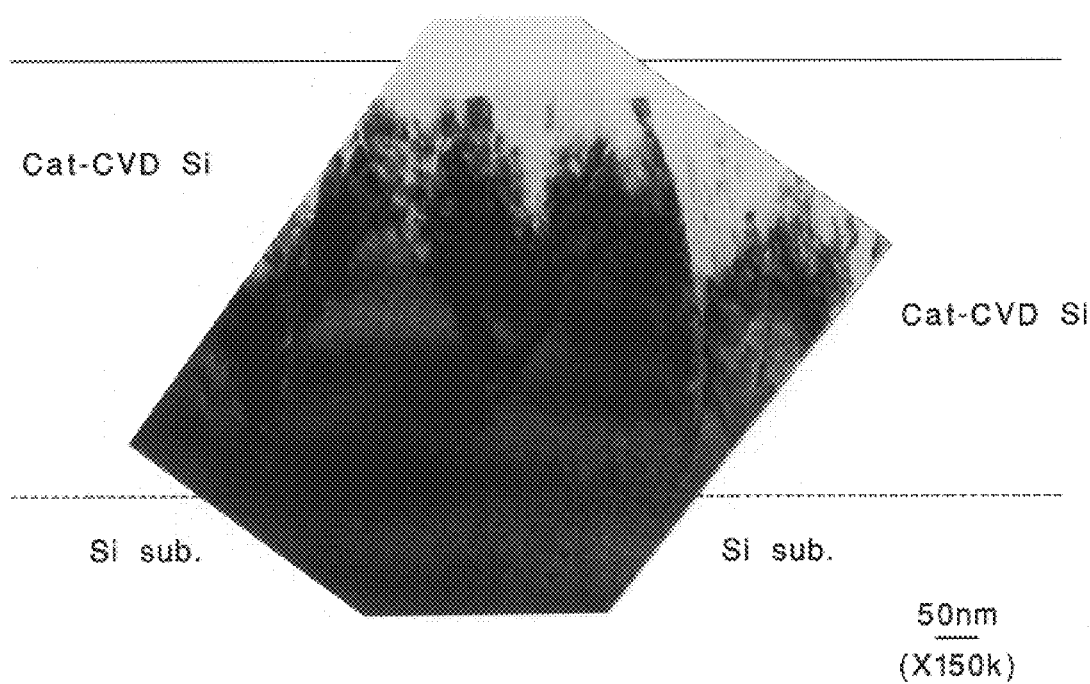
FIG. 27 is a sectional transmission electron microscopic photograph of a sample.

FIGS. 24 through 27 show sectional TEM photographs of the sample 11. FIG. 24 is a sectional TEM photograph of the entire aspect of a cross section of the single crystal silicon layer taken by a low magnification (30000 times). FIG. 25 is a sectional TEM photograph of the entire aspect of a cross section of the single crystal silicon layer taken by a high magnification (75000 times). FIG. 26 is a sectional TEM photograph of the entire aspect of a cross section of the single crystal silicon layer taken by a still higher magnification (1500000 times). FIG. 27 is a sectional TEM photograph of a view of a cross section of the single crystal silicon layer different from that of FIG. 26, taken by the same magnification (1500000 times). It is known from FIGS. 24 through 27 that single crystal silicon layers include a lot of defects and their surfaces are coarse. These single crystal silicon layers epitaxially grow locally from boundaries with single crystal silicon substrates to form triangular epitaxial regions. However, the other regions appearing brighter are considered to be quasi-polycrystalline regions in which crystallographic orientation deviates due to 111 twin crystal, for example.

Figure 28:
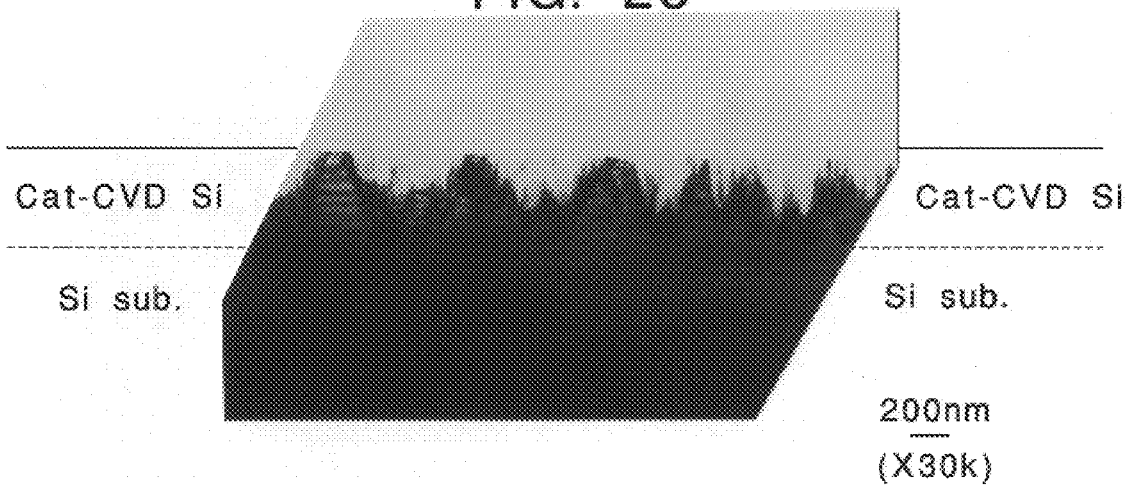
FIG. 28 is a sectional transmission electron microscopic photograph of a sample.
Figure 29:
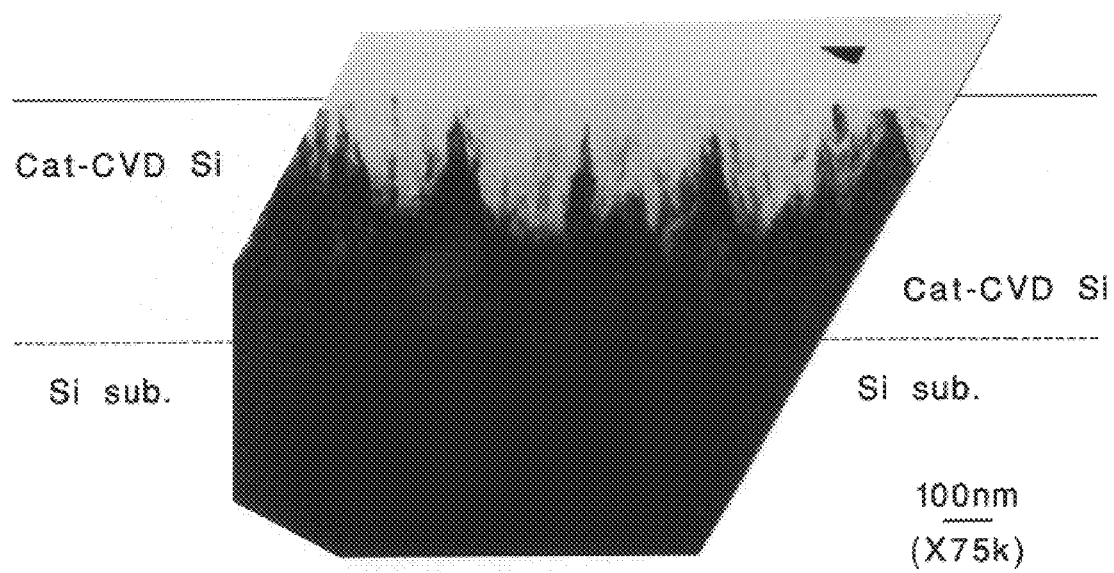
FIG. 29 is a sectional transmission electron microscopic photograph of a sample.
Figure 30:
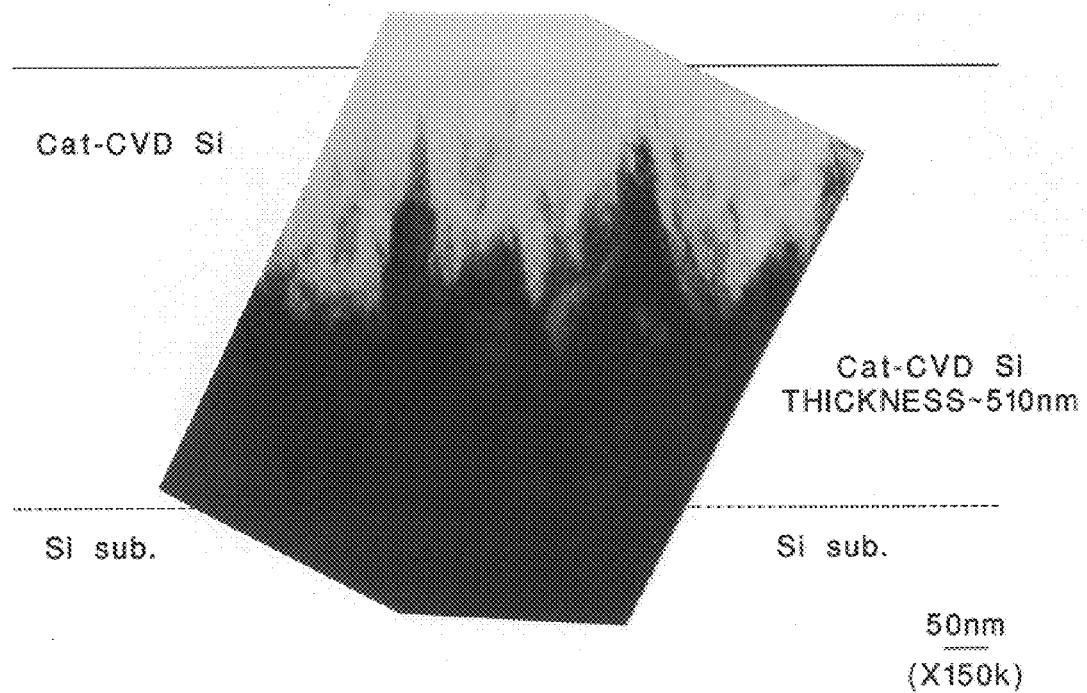
FIG. 30 is a sectional transmission electron microscopic photograph of a sample.
Figure 31:
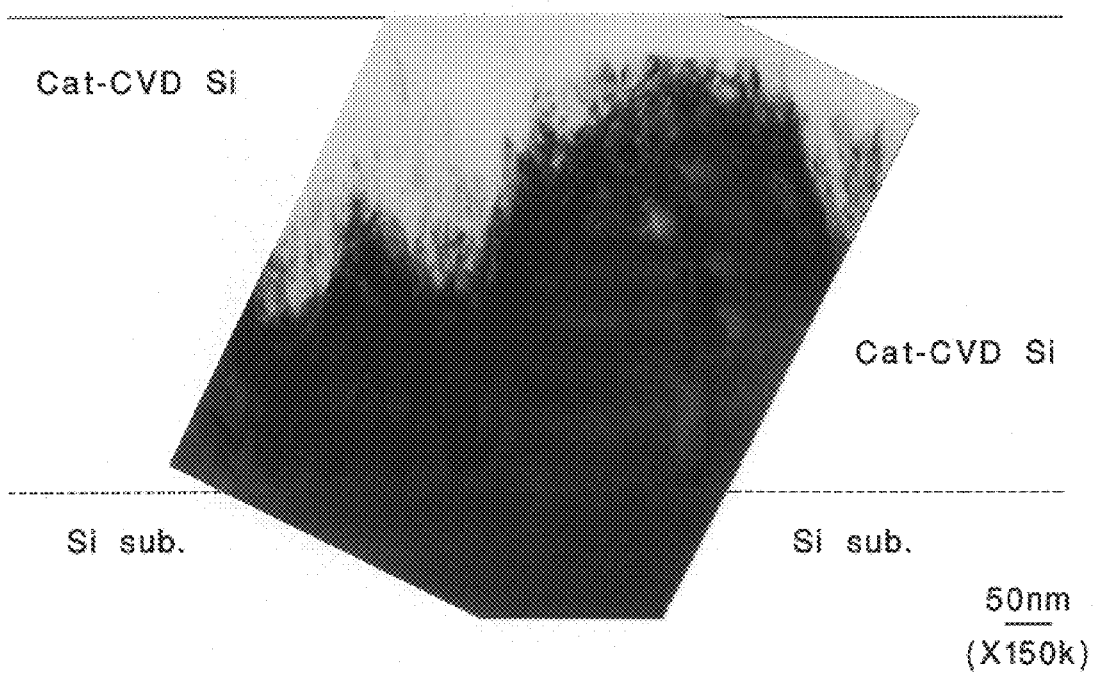
FIG. 31 is a sectional transmission electron microscopic photograph of a sample.

FIGS. 28 through 31 show sectional TEM photographs of the sample 12. FIG. 28 is a sectional TEM photograph of the entire aspect of a cross section of the single crystal silicon layer taken by a low magnification (30000 times). FIG. 29 is a sectional TEM photograph of the entire aspect of a cross section of the single crystal silicon layer taken by a high magnification (75000 times). FIG. 30 is a sectional TEM photograph of the entire aspect of a cross section of the single crystal silicon layer taken by a still higher magnification (1500000 times). FIG. 31 is a sectional TEM photograph of a view of a cross section of the single crystal silicon layer different from that of FIG. 26, taken by the same magnification (1500000 times). It is known from FIGS. 28 through 31 that single crystal silicon layers include a lot of defects and their surfaces are coarse.

As shown and explained above, by using catalytic CVD setting the growth temperature for epitaxial growth of a single crystal silicon layer sufficiently low, namely, around 0.13 Pa (1 mTorr), for example, it is possible to epitaxially grow a single crystal silicon layer having the maximum oxygen concentration not hither than $3 \times 10^{18}$ atoms/cc at least in its region with the thickness of 10 nm, or 50 nm or even 100 nm, from the boundary with the substrate 4. This single crystal silicon layer has a high quality excellent in crystallographic property. In addition to that, by the use of catalytic CVD for epitaxial growth of the single crystal silicon layer, reaction efficiency of reactant gas such as silane is as high as several decade %, and therefore, it contributes to saving resources and decreasing the load to the environment, and simultaneously contributes to a reduction of the growth cost.

Further, since the single crystal silicon layer can be epitaxially grown at a low temperature range of 200 to 600° C., in case of epitaxially growing a single crystal silicon layer on a single silicon substrate with a high impurity concentration, for example, the problem of so-called auto-doping can be prevented. Therefore, single crystal silicon layers can be improved in impurity concentration and thickness control accuracy. Furthermore, especially upon epitaxial growth of a single crystal silicon layer on a sapphire substrate, thermal distortion can be reduced, and auto-doping of aluminum from the sapphire substrate can be prevented substantially to the complete level.

Additionally, since the growth temperature may be as low as 200 to 600° C. as mentioned above, a small power may be used as the heating source of the epitaxial growth apparatus, and the cooling mechanism can be also simplified. This contributes to a reduction of the epitaxial growth apparatus as well.

Figure 32:
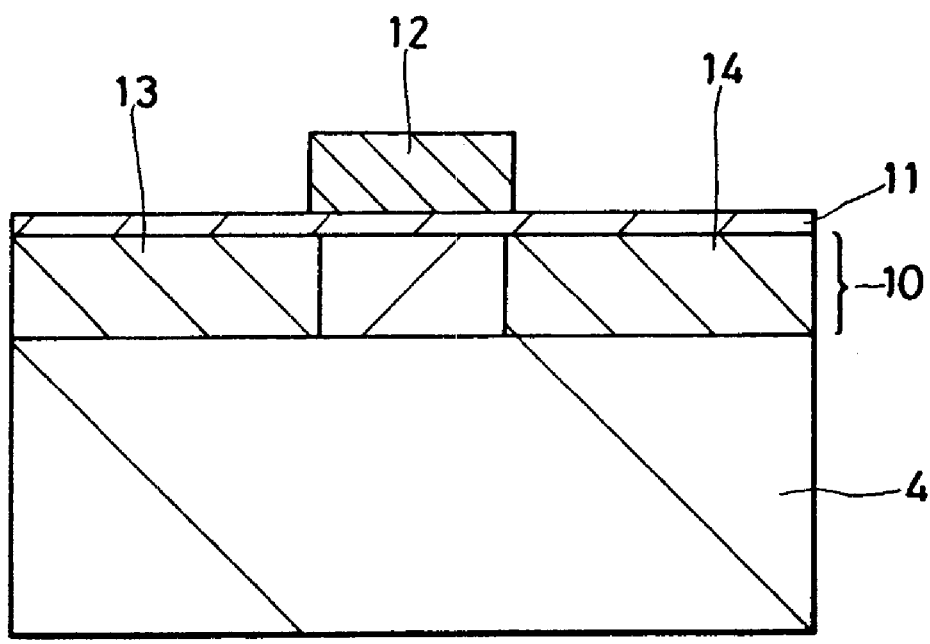
FIG. 32 is a cross-sectional view that shows TFT using a single crystal silicon layer epitaxially grown by catalytic CVD according to an embodiment of the invention.

FIG. 32 shows an example of TFT using a single crystal silicon layer epitaxially grown by the method according to the foregoing embodiment. That is, as shown in FIG. 32, this TFT includes a single crystal silicon layer 10 grown by catalytic CVD according to the foregoing embodiment on a single crystal silicon substrate, sapphire substrate or spinel substrate. Thickness of the single crystal silicon layer 10 is around 10 through 100 nm, and its maximum oxygen concentration is not higher than $3 \times 10^{18}$ atoms/cc. Grown on the single crystal silicon layer 10 is a gate insulating film 11 such as $SiO_2$ film by plasma CVD, for example. Formed on the gate insulating film 11 is a gate electrode 12 made of a polycrystalline silicon layer doped with an impurity, for example. In the single crystal silicon layer 10, a source region 13 and a drain region are formed in self alignment with the gate electrode 12. The polycrystalline silicon layer 10 in the region between these source region 13 and drain region 14 form a carrier channel.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

More specifically, processes, numerical values and substrate materials, for example, are mere proposed examples, and any other appropriate processes, numerical values, substrate materials, and so on, may be used. Additionally, the catalytic CVD apparatus used in the foregoing embodiment is also a mere example, and other catalytic CVD apparatuses different from that in structure are also usable, if necessary. The catalyst may also be other than W.

As described above, according to the invention, in case of epitaxially growing a single crystal silicon layer on a material layer in lattice alignment with single crystal silicon by catalytic CVD, since the single crystal silicon layer is epitaxially grown at least in the initial period of epitaxial growth by maintaining the total pressure of the growth atmosphere in the range from $1.33 \times 10^{-3}$ Pa to 4 Pa, or it is grown at least in the initial period of epitaxial growth by maintaining the partial pressure of oxygen and moisture in the growth atmosphere in the range from $6.65 \times 10^{-10}$ to $2 \times 10^{-6}$ Pa, it is possible to epitaxially grow the single crystal silicon layer having an oxygen concentration not higher than $3 \times 10^{18}$ atoms/cm$^3$ at least in a portion with the thickness of 10 nm from the boundary between the material layer in lattice alignment with single crystal silicon and the single crystal silicon layer. This single crystal silicon layer has a high quality. Additionally, by using this single crystal silicon layer, a high-performance semiconductor device can be realized as well.

What is claimed is:

1. A single crystal silicon layer epitaxially grown by catalytic CVD on a material layer in lattice alignment with single crystal silicon, characterized in:

a maximum oxygen concentration thereof being not higher than $3 \times 10^{18}$ atoms/cm$^3$ at least in a region having the thickness of 10 nm thick from the boundary between said material layer and said single crystal silicon layer.

2. The single crystal silicon layer according to claim 1 wherein the maximum oxygen concentration thereof is not higher than $2 \times 10^{18}$ atoms/cm$^3$ at least in a region having the thickness of 10 nm from the boundary between said material layer and said single crystal silicon layer.

3. The single crystal silicon layer according to claim 1 wherein the maximum oxygen concentration thereof is not higher than $3 \times 10^{18}$ atoms/cm$^3$ at least in a region having the thickness of 50 nm from the boundary between said material layer and said single crystal silicon layer.

4. The single crystal silicon layer according to claim 1 wherein the maximum oxygen concentration thereof is not higher than $3 \times 10^{18}$ atoms/cm$^3$ at least in a region having the thickness of 100 nm from the boundary between said material layer and said single crystal silicon layer.

5. A single crystal silicon layer having a thickness not exceeding 1 μm epitaxially grown by catalytic CVD on a material layer in lattice alignment with single crystal silicon, characterized in:

the maximum oxygen concentration thereof being not higher than $3 \times 10^{18}$ atoms/cm$^3$.

6. The single crystal silicon layer according to claim 5 wherein thickness of said single crystal silicon layer does not exceed 100 nm.

7. The single crystal silicon layer according to claim 5 wherein the maximum oxygen concentration there of is not higher than $2 \times 10^{18}$ atoms/cm$^3$.

8. A single crystal silicon layer epitaxially grown by catalytic CVD on a material layer in lattice alignment with single crystal silicon, characterized in:

being epitaxially grown by maintaining the total pressure of the growth atmosphere in the range from $1.33 \times 10^{-3}$ Pa to 4 Pa at least in an initial period of the epitaxial growth.

9. A single crystal silicon layer epitaxially grown by catalytic CVD on a material layer in lattice alignment with single crystal silicon, characterized in:

being epitaxially grown by maintaining the partial pressure of oxygen and moisture in the growth atmosphere in the range from $6.65 \times 10^{-10}$ Pa to $2 \times 10^{-6}$ Pa at least in an initial period of the epitaxial growth.

* * * * *